US012812908B2

(12) United States Patent
Wu et al.

(10) Patent No.: US 12,812,908 B2
(45) Date of Patent: Nov. 24, 2026

(54) DRIVING BACKPLANES, METHODS OF MANUFACTURING A DRIVING BACKPLANE, AND DISPLAY PANELS

(71) Applicant: GUANGZHOU CHINA STAR OPTOELECTRONICS SEMICONDUCTOR DISPLAY TECHNOLOGY CO., LTD., Guangzhou (CN)

(72) Inventors: Wei Wu, Guangzhou (CN); Yunlong Li, Guangzhou (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 681 days.

(21) Appl. No.: 18/214,695

(22) Filed: Jun. 27, 2023

(65) Prior Publication Data

US 2024/0282783 A1 Aug. 22, 2024

(30) Foreign Application Priority Data

Feb. 17, 2023 (CN) ......................... 202310133327.5

(51) Int. Cl.
*H10D 30/67* (2025.01)
*H10D 86/01* (2026.01)

(52) U.S. Cl.
CPC ..... *H10D 30/6734* (2025.01); *H10D 86/0231* (2025.01)

(58) Field of Classification Search
CPC ....................... H10D 30/6734; H10D 86/0231
See application file for complete search history.

(56) References Cited

U.S. PATENT DOCUMENTS

2010/0244022 A1* 9/2010 Takahashi .......... H10D 30/6734 257/43
2015/0108481 A1* 4/2015 Khang ............... H10D 30/6734 257/59
2024/0014217 A1* 1/2024 Huang ............... H10D 30/6734

* cited by examiner

*Primary Examiner* — Peter M Albrecht
(74) *Attorney, Agent, or Firm* — The Roy Gross Law Firm, LLC; Roy Gross

(57) ABSTRACT

A driving backplane includes a substrate, a first gate, an active layer, and a second gate which are sequentially stacked. The second gate is connected to the first gate. A first orthographic projection of the first gate has a first side line and a second side line opposite to each other. A second orthographic projection of the second gate has a third side line and a fourth side line opposite to each other. A source region and a channel region have a first boundary line therebetween, and a drain region and a channel region have a second boundary line therebetween.

5 Claims, 16 Drawing Sheets

| | LS-S（Top-gate） | LS-G（Double-gate） |
|---|---|---|
| Saturation mobility $cm^2/V\,s$（calculated based on the top-gate） | 6.47 | 14.17（119% ↑） |
| Threshold voltage Vth/V | 0.60 | 0.51 |
| Subthreshold swing SS | 0.26 | 0.26 |
| On-state current Ion/A（Vds=20V，Vgs=10V） | 3.10E-05 | 5.75E-05（85% ↑） |
| Id-Vd |  |  |

DRIVING BACKPLANES, METHODS OF MANUFACTURING A DRIVING BACKPLANE, AND DISPLAY PANELS

CROSS-REFERENCE TO RELATED APPLICATION

This application claims priority to and the benefit of Chinese Patent Application No. 202310133327.5, filed on Feb. 17, 2023, the disclosure of which is incorporated herein by reference in its entirety.

TECHNICAL FIELD

The present disclosure relates to display technologies, and in particular, to driving backplanes, methods of manufacturing a driving backplane, and display panels.

BACKGROUND

The Mini LED (light-emitting diode) light-emitting device requires a high on-state current of the transistor due to a large display current. In order to increase the on-state current of the transistor, the existing solution is to adjust the structure of the transistor in the driving backplane from the original single gate structure to the dual gate structure. As shown in FIG. 1, which is a schematic diagram of comparison of the performance parameters of a transistor having a top-gate structure and a transistor having a double-gate structure, the on-state current of the transistor having the double-gate structure is increased by 85% in comparison with the on-state current of the transistor having the top-gate structure, which is equivalent to an increase in the saturation mobility of the transistor having the double-gate structure by 119%, which is a significant improvement in the performance of the Mini LED light-emitting device.

As shown in FIGS. 2A and 2B, which are a top view of an existing driving backplane having the transistor with the top-gate structure and a cross-sectional view taken along a line A-A of FIG. 2A respectively, and FIGS. 3A and 3B, which are a top view of a driving backplane having the transistor with the double-gate structure and a cross-sectional view taken along a line A-A of FIG. 3A respectively, in FIGS. 2A and 2B, the driving backplane includes, from bottom to top, a substrate 101, a light shielding layer 102, a first gate insulating layer 103, an active layer 104, a second gate insulating layer 105, a second gate 106, an interlayer dielectric layer 107, a source-drain layer, and a passivation layer 109, the source-drain layer includes a source 1081 and a drain 1082, the source 1081 is connected to a source region of the active layer 104 through a first via hole 11, the drain 1082 is connected to a drain region of the active layer 104 through a second via hole 12, and the light shielding layer 102 includes an opaque conductive material. In the top-gate structure, there is no parasitic capacitance. In FIGS. 3A and 3B, the light-shielding layer 102 serves as a first gate, and the source-drain layer further includes a double-gate connection line 1083 connected to the second gate 106 through a third via hole 13 and to the light shielding layer 102 through a fourth via hole 14. In the double-gate structure, there is an overlap part between a projection of each of a source region 1041 and a drain region 1042 in the vertical direction and a projection of the first gate 102 in the vertical direction, and the overlap part may cause a parasitic capacitance, which may affect the operation of the display driving circuit.

As can be seen from the above comparison, although the performance of the Mini LED light-emitting device may be greatly improved by the double-gate structure, the double-gate structure may cause a larger parasitic capacitance.

SUMMARY

In view of the above, an embodiment of the present disclosure provides a driving backplane including: a substrate; a first gate disposed on the substrate; an active layer disposed on a side of the first gate away from the substrate, the active layer includes a source region, a drain region, and a channel region; and a second gate disposed on a side of the active layer away from the first gate and connected to the first gate. A first orthographic projection of the first gate on the active layer includes a first side line and a second side line opposite to each other. A second orthographic projection of the second gate on the active layer includes a third side line and a fourth side line opposite to each other. At least a part of the first side line coincides with the third side line, and/or at least a part of the second side line coincides with the fourth side line. A part of the third side line intersecting the active layer constitutes a first boundary line between the source region and the channel region, and a part of the fourth side line intersecting the active layer constitutes a second boundary line between the drain region and the channel region.

An embodiment of the present disclosure also provides a method of manufacturing a driving backplane, including: providing a substrate; forming a first gate on a first side of the substrate; and forming an active layer and a second gate sequentially stacked on the first gate. The active layer includes a source region, a drain region, and a channel region. A first orthographic projection of the first gate on the active layer includes a first side line and a second side line opposite to each other. A second orthographic projection of the second gate on the active layer includes a third side line and a fourth side line opposite to each other. At least a part of the first side line coincides with the third side line, and/or at least a part of the second side line coincides with the fourth side line. A part of the third side line intersecting the active layer constitutes a first boundary line between the source region and the channel region, and a part of the fourth side line intersecting the active layer constitutes a second boundary line between the drain region and the channel region.

An embodiment of the present disclosure also provides a display panel including the driving backplane described in any one of the above.

BRIEF DESCRIPTION OF THE DRAWINGS

The technical solutions and other beneficial effects of the present disclosure will be apparent from the following detailed description of specific embodiments thereof, taken in conjunction with the accompanying drawings.

DETAILED DESCRIPTION

Figure 1:
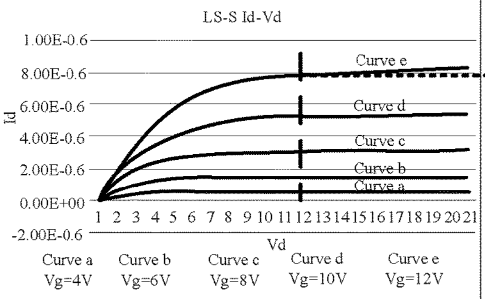
FIG. 1 is a schematic diagram of comparison of performance parameters of a transistor with top-gate structure and a transistor with dual-gate structure for a Mini LED device in the related art.
Figure 1:
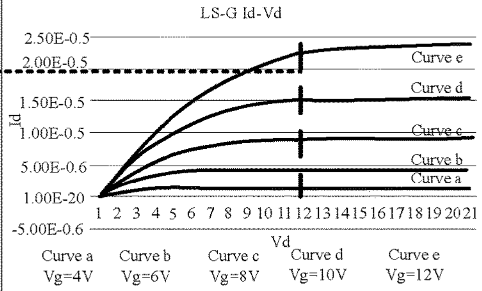
Figure 2A:
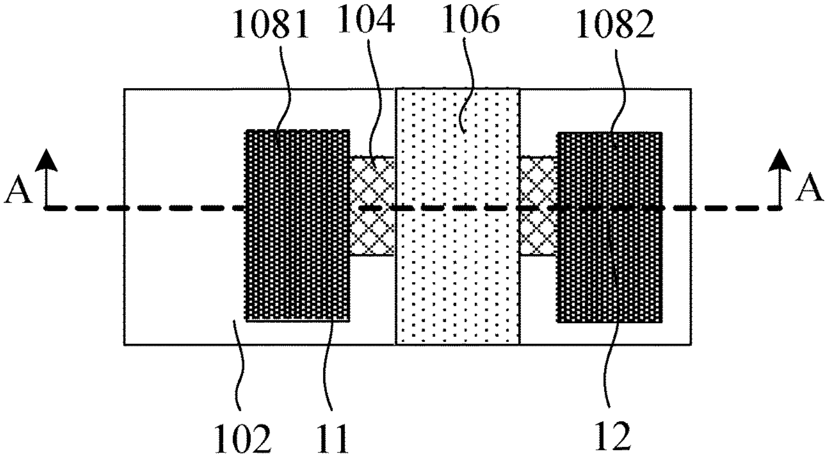
FIG. 2A is a top view of a driving backplane having a transistor with the top-gate structure in the related art.
Figure 2B:
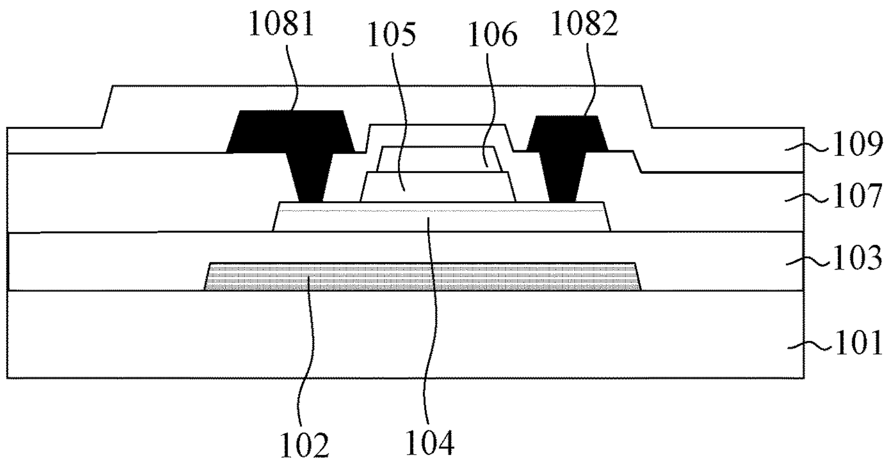
FIG. 2B is a cross-sectional view of the driving backplane taken along a line A-A of FIG. 2A.

Some embodiments of the present disclosure will be described in detail below in conjunction with the drawings. It should be understood that the described embodiments are only to illustrate and explain the present disclosure, but not intended to limit the present disclosure.

In the description of the present disclosure, it should be understood that orientations or position relationships indicated by the terms “center”, “longitudinal”, “lateral”, “length”, “width”, “thickness”, “upper”, “lower”, “front”, “rear”, “left”, “right”, “vertical”, “horizontal”, “top”, “bottom”, “inside”, “outside”, “clockwise”, and “counter-clockwise” are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the terms “first”, “second” are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural (or a plurality of)" is two or more, unless otherwise specifically defined.

In the description of the present disclosure, it should be noted that the terms "installation", "connection" and "coupling" should be understood in a broad sense, unless otherwise clearly specified and defined. For example, it can be a fixed connection, a detachable connection, or integrated connection; it can be a mechanical connection, an electrical connection or can communicate with each other; it can be directly connected or indirectly connected through an intermediary, it can also be the connection between two elements or the interaction between two elements. Those ordinary skilled in the art can understand the specific meanings of the above terms in the present disclosure according to specific situations.

In the present disclosure, it should be noted that unless otherwise clearly defined and limited, a first feature "on" or "beneath" a second feature may mean that the first feature directly contacts the second feature, or that the first feature contacts the second feature via an additional feature there between instead of directly contacting the second feature. Moreover, the first feature "above", "over", and "on" the second feature may mean that the first feature is right over or diagonally above the second feature or mean that the first feature has a horizontal height higher than that of the second feature. The first feature "below", "under", and "beneath" the second feature may mean that the first feature is right under or diagonally below the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, in the present disclosure, reference numerals and reference letters may be repeated in different examples, which is for purposes of simplicity and clarity and does not indicate a relationship of the various embodiments and/or the settings. Furthermore, the present disclosure provides specific examples of various processes and materials, however, applications of other processes and/or other materials may be appreciated by those skilled in the art.

In this context, terms such as "conductorize", "conductorized", "conductorization" or "conductorization treatment" may be meant to "make at least a part of a layer (i.e. semiconductor layer or active layer) conductive.

An embodiment of the present disclosure provides a driving backplane, a method of manufacturing a driving backplane, and a display panel to alleviate a technical problem of a large parasitic capacitance existing in an existing driving backplane having a transistor with a double-gate structure.

Figure 4A:
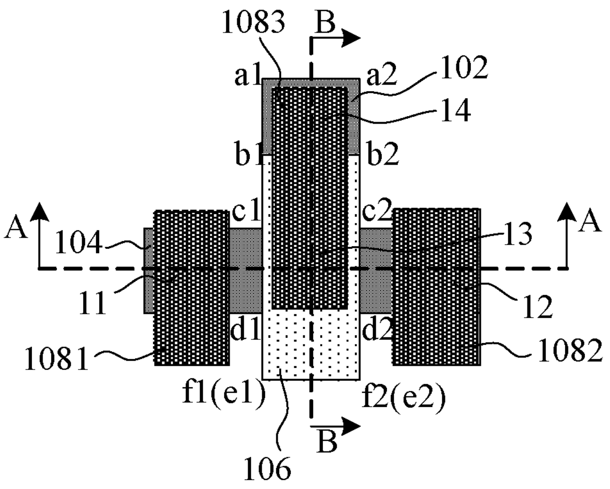
FIG. 4A is a top view of a first structure of a driving backplane according to an embodiment of the present disclosure.
Figure 4B:
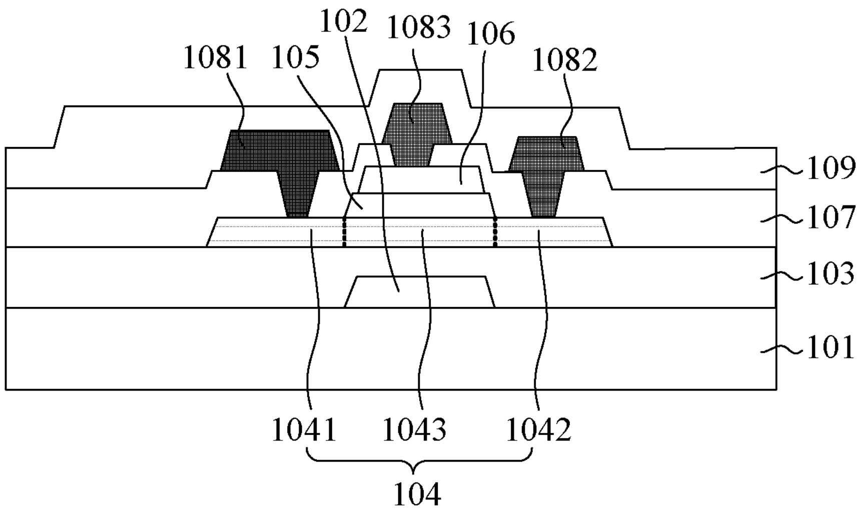
FIG. 4B is a cross-sectional view of the driving backplane taken along a line A-A of FIG. 4A.
Figure 4C:
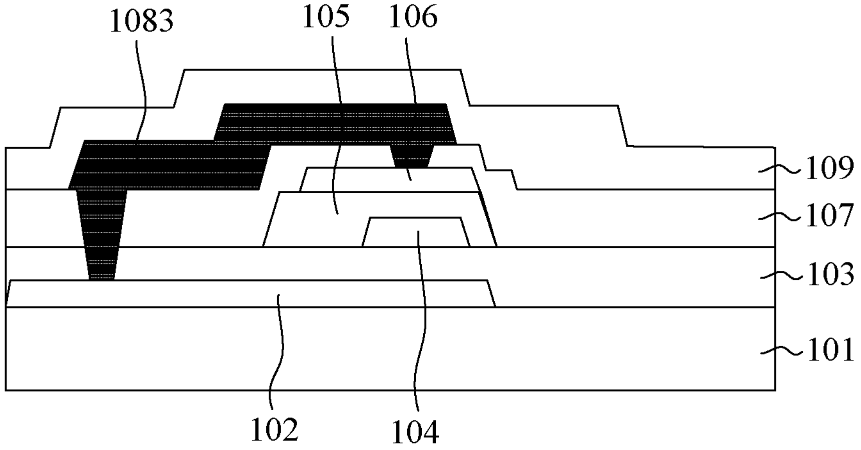
FIG. 4C is a cross-sectional view of the driving backplane taken along a line B-B of FIG. 4A.

As shown in FIGS. 4A to 4C, which are a top view, a cross-sectional view taken along the line A-A, and a cross-sectional view taken along the line B-B, of a first structure of a driving backplane according to an embodiment of the present disclosure, respectively, the driving backplane includes a substrate 101, a first gate 102, an active layer 104, and a second gate 106. The first gate 102 is disposed on the substrate 101, the active layer 104 is disposed on the first gate 102, the active layer 104 includes a source region 1041, a drain region 1042, and a channel region 1043, and a first orthographic projection of the first gate 102 on the active layer 104 includes first and second side lines opposite to each other. The second gate 106 is disposed on a side of the active layer 104 away from the first gate 102 and connected to the first gate 102, a second orthographic projection of the second gate 106 on the active layer 104 includes third and fourth side lines opposite to each other, at least a part of the first side line overlaps the third side line, and/or at least a part of the second side line overlaps the fourth side line, an intersecting part of the active layer 104 and the third side line is formed as a first boundary line between the source region 1041 and the channel region 1043, and an intersecting part of the active layer 104 and the fourth side line is formed as a second boundary line between the drain region 1042 and the channel region 1043.

The substrate 101 may be a flexible substrate or a rigid substrate. The first gate 102 is disposed on a first side of the substrate 101, the first side shown in FIG. 4A to 4C refers to an upper surface of the substrate 101, and the first gate 102 includes a conductive material.

The active layer 104 includes an oxide semiconductor material, such as IGZO or the like, and includes the source region 1041, the drain region 1042, and the channel region 1043, and the source region 1041 and the drain region 1042 may be formed by performing the conductorization using plasma bombardment, ion implantation, or the like. Taking a horizontal plane where a bottom surface of the active layer 104 is located as the reference surface, a first orthographic projection is formed by projecting the first gate 102 in a vertical direction onto the reference plane, and the first orthographic projection includes the first side line and the second side line opposite to each other. In FIG. 4A, the first side line is represented by a line segment a1f1, the second side line is represented by a line segment a2f2, and an outer contour line of the first orthographic projection is represented by a1f1f2a2.

The second gate 106 is disposed on a side of the active layer 104 away from the first gate 102, and the second gate 106 includes a conductive material. The second gate 106 is connected to the first gate 102 to form the double-gate structure.

The second gate 106 is projected in the vertical direction onto the horizontal reference plane of the active layer 104 to form a second orthographic projection, and the second orthographic projection includes third and fourth side lines opposite to each other. In FIG. 4A, the third side line is represented by a line segment b1e1, the fourth side line is represented by a line segment b2e2, and an outer contour line of the second orthographic projection is represented by b1e1e2b2. An intersecting part of the third side line b1e1 and the active layer 104 is represented by a line segment c1d1, a intersecting part of the fourth side line b2e2 and the active layer 104 is represented by a line segment c2d2, the channel region 1043 is formed in an area enclosed by c1d1d2c2 in the active layer 14, the source region 1041 is formed in an area to the left of the line segment c1d1, the drain region 1042 is formed in an area to the right of the line segment c2d2, the line segment c1d1 is a first boundary line between the source region 1041 and the channel region 1043, and the line segment c2d2 is a second boundary line between the drain region 1042 and the channel region 1043. In this manner, the second gate 106 and the source region 1041 are self-aligned in the vertical direction through the third side line b1e1 and the first boundary line c1d1, and the second gate 106 and the drain region 1042 are self-aligned in the vertical direction through the fourth side line b2e2 and the second boundary line c2d2, such that the second orthographic projection of the second gate does not overlap the source region 1041 and the drain region 1042.

Figure 5A:
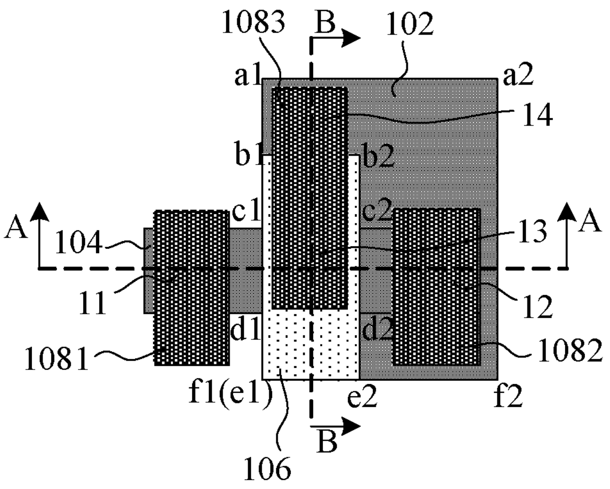
FIG. 5A is a top view of a second structure of a driving backplane according to an embodiment of the present disclosure.

At least part of the first side line a1f1 coincides with the third side line b1e1, and/or at least part of the second side line a2f2 coincides with the fourth side line b2e2, which may include three cases: at least part of the first side line a1f1 coincides with the third side line b1e1, and at least part of the second side line a2f2 coincides with the fourth side line b2e2; at least a part of the first side line a1f1 coincides with the third side line b1e1, and the second side line a2f2 does not coincide with the at least a part of the fourth side line b2e2; and the first side line a1f1 does not coincide with at least a part of the third side line b1e1, and at least a part of the second side line a2f2 coincides with the fourth side line b2e2. The first case is shown in FIG. 4A, and the second case is shown in FIG. 5A. The third case is similar to the case shown in FIG. 5A, except that they mirror each other, and thus, the following embodiments are described with reference to FIG. 5A as an example. At least part of the first side line a1f1 coincides with the third side line b1e1, which means that the third side line b1e1 coincides with part or all of the line segments in the first side line a1f1, and at least part of the second side line a2f2 coincides with the fourth side line b2e2, which means that the fourth side line b2e2 coincides with part or all of the line segments in the second side line a2f2. In this manner, the first gate 102 and the second gate 106 are self-aligned in the vertical direction through the coinciding part of the first side line a1f1 and the third side line b1e1, and/or are self-aligned in the vertical direction through the coinciding part of the second side line a2f2 and the fourth side line b2e2.

Figure 3A:
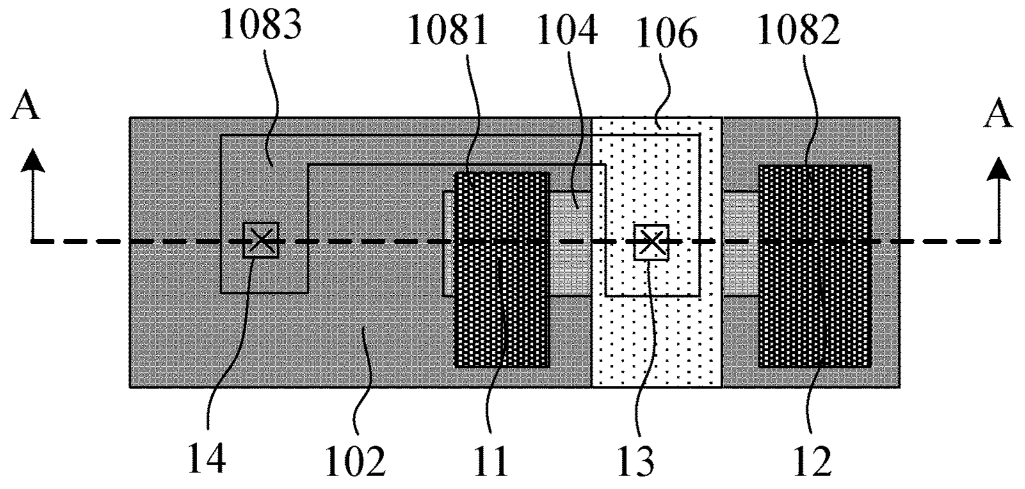
FIG. 3A is a top view of a driving backplane having a transistor with the dual-gate structure in the related art.
Figure 3B:
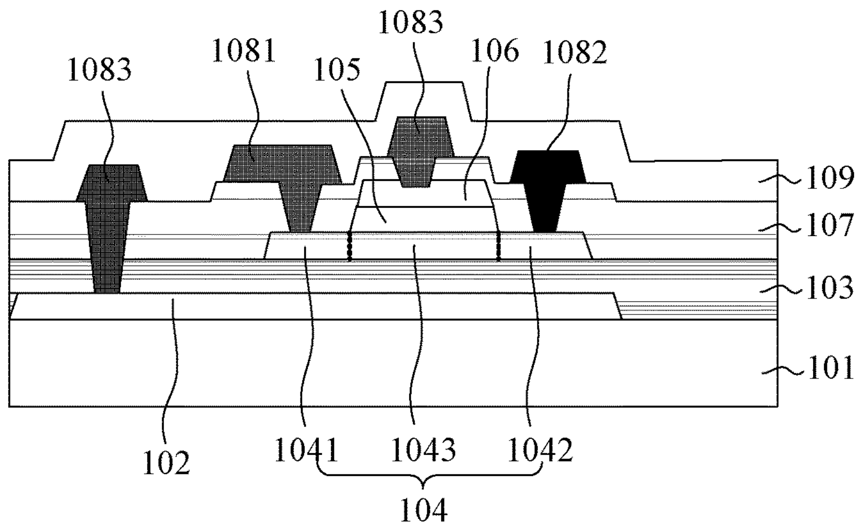
FIG. 3B is a cross-sectional view of the driving backplane taken along a line A-A of FIG. 3A.

As shown in FIGS. 3A and 3B, in the existing dual-gate structure, the first orthographic projection of the first gate 102 on the substrate 101 covers the channel region 1043 of the active layer 104, and also covers all of the source region 1041 and the drain region 1042, so that parasitic capacitance may be generated between the source region 1041 and the first gate 102, and between the drain region 1042 and the first gate 102, which affects the operation of the driving circuit.

In an embodiment of the present disclosure, when the double-gate structure shown in FIG. 4A to FIG. 4C is adopted, since at least part of the first side line a1f1 coincides with the third side line b1e1, the second gate 106 and the first gate 102 are self-aligned in the vertical direction through the coinciding part of the third side line b1e1 and the first side line a1f1, and since the second gate 106 and the source region 1041 are self-aligned in the vertical direction through the third side line b1e1 and the first boundary line c1d1, the second orthographic projection of the second gate 106 does not overlap the source region 1041. Therefore, the first orthographic projection of the first gate 102 does not cover the source region 1041 by the double self-alignment, so that the parasitic capacitance is not generated between the source region 1041 and the first gate 102. At the same time, since at least part of the second side line a2f2 coincides with the fourth side line b2e2, the second gate 106 and the first gate 102 are self-aligned in the vertical direction through the coinciding part of the fourth side line b2e2 and the second side line a2f2, and since the second gate 106 and the drain region 1042 are self-aligned in the vertical direction through the fourth side line b2e2 and the second boundary line c2d2, the second orthographic projection of the second gate 106 does not overlap the drain region 1042. Therefore, the first orthographic projection of the first gate 102 does not cover the drain region 1042 by double self-alignment, so that the parasitic capacitance is not generated between the drain region 1042 and the first gate 102. Compared with the structure shown in FIGS. 3A and 3B, the structure shown in FIGS. 4A to 4C do not generate parasitic capacitance in both the source region 1041 and the drain region 1042, so that the parasitic capacitance is eliminated, thereby alleviating the technical problem that the parasitic capacitance in the current driving backplane in which the double-gate transistor is currently used is larger.

Figure 5B:
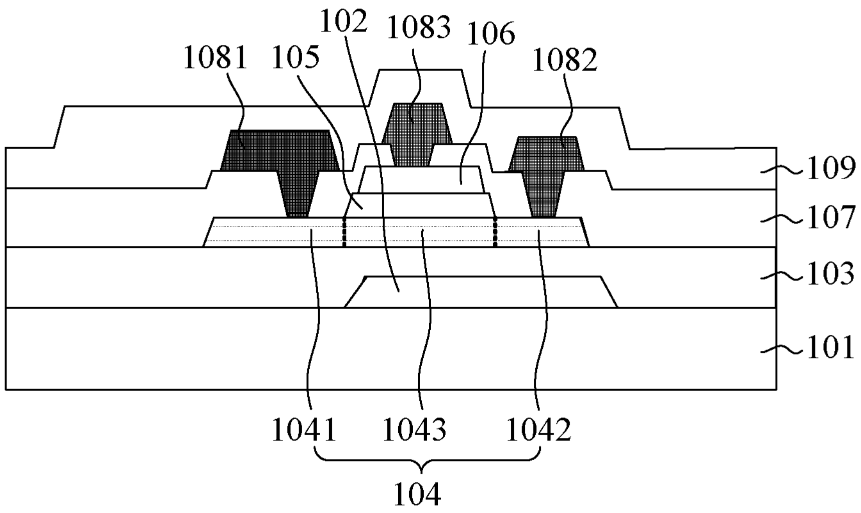
FIG. 5B is a cross-sectional view of the driving backplane taken along a line A-A of FIG. 5A.
Figure 5C:
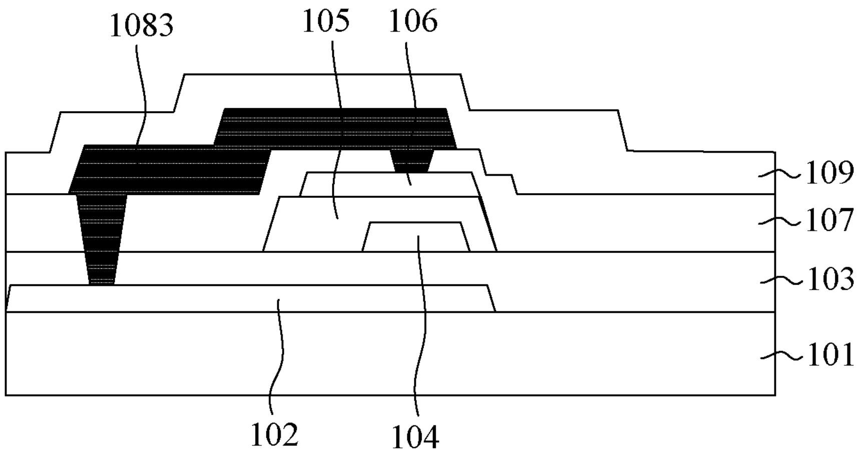
FIG. 5C is a cross-sectional view of the driving backplane taken along a line B-B of FIG. 5A.

When the structure shown in FIGS. 5A to 5C is used, although the parasitic capacitance is not generated only in the source region 1041, the parasitic capacitance is reduced compared with the structure shown in FIGS. 3A and 3B, and the technical problem of the larger parasitic capacitance in the current driving backplane in which the double-gate structure transistor is used is alleviated to some extent.

The driving backplane also includes the first gate insulating layer 103 and the second gate insulating layer 105. The first gate insulating layer 103 is disposed on the side of the first gate 102 away from the substrate 101 and covers the substrate 101, and the second gate insulating layer 105 is disposed between the second gate 106 and the active layer 104.

The driving backplane further includes the interlayer dielectric layer 107 disposed on a side of the second gate 106 away from the substrate 101, and the source-drain layer disposed on a side of the interlayer dielectric layer 107 away from the substrate 101, the source-drain layer includes the source 1081 connected to the source region 1041 of the active layer 104, the drain 1082 connected to the drain region 1042 of the active layer 104, and a double-gate connection line 1083 connected at both ends to the first gate 102 and the second gate 106, respectively.

The interlayer dielectric layer 107 is integrally formed to cover the second gate 106 and the first gate insulating layer 103, and the interlayer dielectric layer 107 is made of an inorganic material. The source-drain layer includes the source 1081 connected to the source region 1041 of the active layer 104 through a via hole, the drain 1082 connected to the drain region 1042 of the active layer 104 through a via hole, and the double-gate connection line 1083 connected at both ends to the first gate 102 and the second gate 106 through via holes, respectively. The source 1081 and the drain 1082 are independent of the double-gate connection line 1083, that is, independent transmission of the control signal may be realized. When the driving circuit is formed, the first gate 102 is connected to a first gate driving signal line to receive a first gate driving signal, the second gate 106 is connected to a second gate driving signal line to receive a second gate driving signal, the transistor is turned on under the joint action of the first gate driving signal and the second gate driving signal, one of the source 1081 and the drain 1082 is connected to a data line to receive a data signal, and a current is formed between the source region 1041 and the drain region 1042 of the active layer 104, so that the driving circuit may operate normally. Since the double-gate structure may be operated under the joint action of the first gate driving signal and the second gate driving signal, the on-state current may be increased, so that the brightness of the display panel may be improved.

The passivation layer 109 is also included over the source-drain layer, the passivation layer 109 is prepared as a whole, covers the source-drain layer and the interlayer dielectric layer 107.

In an embodiment, the first gate 102 includes an opaque conductive material, the second gate 106 includes a transparent conductive material, and the second orthographic projection is located within the range of the first orthographic projection. The material of the first gate 102 may be a MoTi/Cu or the like. When the first gate 102 includes the opaque conductive material, the first gate 102 may be used as a mask to form the second gate 106 so that the second orthographic projection of the prepared second gate 106 is within the range of the first orthographic projection of the first gate 102. The material of the second gate 106 may be ITO, IZO, or the like, and when it is a transparent conductive material, the aperture ratio may be improved.

When dual self-alignment is realized, the active layer 104, a conductive layer, and a photoresist layer which are stacked are first prepared on the side of the first gate 102 away from the substrate 101, and each of the conductive layer and the photoresist layer is prepared as whole. Then, since the first gate 102 includes the opaque conductive material, the first gate 102 may be used as a mask, UV light is irradiated from the second side (i.e., the bottom surface) of the substrate 101 to obtain an unexposed first photoresist part and an exposed second photoresist part. Then, the mask plate is used as a mask to overlap the hollow area of the mask plate with the partial area of the first photoresist part, and the photoresist layer is irradiated with UV light for a second time from the first side (i.e., the top surface) of the substrate 101, to obtain an unexposed first sub-photoresist part and an exposed second sub-photoresist part in the first photoresist part. Finally, the photoresist layer is developed to remove the second photoresist part and the second sub-photoresist part to obtain a photoresist pattern. The photoresist pattern is of the same shape and size as the final desired second gate 106. The photoresist pattern forms a third orthographic projection on the horizontal reference plane of the active layer 104, the third orthographic projection includes fifth and sixth side lines opposite to each other, at least part of the first side line a1f1 coincides with the fifth side line, and/or at least part of the second side line a2f2 coincides with the sixth side line. In this manner, the first gate 102 and the photoresist pattern are self-aligned in the vertical direction through the coinciding part of the first side line a1f1 and the fifth side line, and/or are self-aligned in the vertical direction through the coinciding part of the second side line a2f2 and the sixth side line.

The above first exposure step causes the unexposed first photoresist part to fully coincide with the first gate 102 in the vertical direction, thereby achieving self-alignment of the two. The above second exposure step and the developing step remove a part of the excess second sub-photoresist part from the first photoresist part, leaving a position for the connection point of the subsequent double-gate connection line 1083 and the first gate 102.

With the photoresist pattern as a mask, the conductive layer is etched to obtain the second gate 106. With the second gate 106 as a mask, non-shielded regions of the active layer 104 are conductorized to form the source region 1041 and the drain region 1042, and a shielded region of the active layer 104 is formed as the channel region 1043, so that the self-alignment of the second gate 106, and the source region 1041 and the drain region 1042 is realized. Finally, the structures shown in FIGS. 4A to 4C or FIGS. 5A to 5C are obtained.

Since the second gate insulating layer 105 is further included between the active layer 104 and the second gate 106. In the above-described step, the entire insulating layer may be first formed between the active layer 104 and the conductive layer, and then, in the etching step, the conductive layer and the insulating layer are simultaneously etched by using the photoresist pattern as a mask to obtain the second gate 106 and the second gate insulating layer 105. The second orthographic projection of the second gate 106 on the active layer 104 coincides with the fourth orthographic projection of the second gate insulating layer 105 on the active layer 104, and then, the regions where the active layer 104 is not shielded are conductorized by using the second gate 106 and the second gate insulating layer 105 as a mask.

In the related art, the first gate 102 and the second gate 106 are separately formed, and the active layer 104 is aligned with the second gate 106 only, but not with the first gate 102, so that the first gate 102 overlaps the source region 1041 and/or the drain region 1042 in the vertical direction to generate a parasitic capacitance.

In the embodiment of the present disclosure, the first gate 102 is used as a mask to form the second gate 106 and the second gate insulating layer 105, so that the self-alignment of the first gate 102 and the second gate 106 is realized, and the source region 1041, the drain region 1042, and the channel region 1043 of the active layer 104 are formed by using the second gate 106 as a mask, so that the self-alignment of the second gate 106 and the channel region 1043 is realized. It may be accurately controlled using the dual self-alignment that the first gate 102 does not cover the source region 1041 and/or the drain region 1042, and the parasitic capacitance may be reduced or eliminated.

In an embodiment, the source 1081 is connected to the source region 1041 of the active layer 104 through the first via hole 11 in the interlayer dielectric layer 107, the drain 1082 is connected to the drain region 1042 of the active layer 104 through the second via hole 12 in the interlayer dielectric layer 107, the first end of the dual-gate connection line 1083 is connected to the second gate 106 through the third via hole 13 in the interlayer dielectric layer 107, and the second end of the dual-gate connection line 1083 is connected to the first gate 102 through the fourth via hole 14 in the interlayer dielectric layer 107, the first orthographic projection includes a first sub-orthographic projection and a second sub-orthographic projection, the first sub-orthographic projection coincides with the second orthographic projection, the second sub-orthographic projection does not overlap the second orthographic projection, the third via hole 13 is formed in the first sub-orthographic projection, and the fourth via hole 14 is formed in the second sub-orthographic projection.

The first via hole 11 extends through the interlayer dielectric layer 107 and is located in the source region 1041, the second via hole 12 extends through the interlayer dielectric layer 107 and is located in the drain region 1042, the third via hole 13 extends through the interlayer dielectric layer 107 and is located in the region where the second gate 106 is located, and the fourth via hole 14 extends through the interlayer dielectric layer 107 and the first gate insulating layer 103 and is located in the region where the first gate 102 is located. Since the second gate 106 needs to be connected to the first gate 102 through the dual-gate connection line 1083, and the dual-gate connection line 1083 needs to be connected to the first gate 102 through the fourth via hole 14, in order to avoid a short circuit caused by the existence of two connection points between the second gate 106 and the dual-gate connection line 1083, the fourth via hole 14 needs to be provided in an area not covered by the second orthographic projection of the second gate 106. Therefore, the second orthographic projection of the second gate 106 only partially coincides with the first orthographic projection of the first gate 102, the coinciding part is the first sub-orthographic projection, which is represented by b1e1e2b2 in FIG. 4A, and the non-coinciding part a1b1b2a2 is the second sub-orthographic projection. When the third via hole 13 is formed in the first sub-orthographic projection, the first end of the double-gate connection line 1083 is connected to the top of the second gate 106.

As can be seen from the above embodiments, in the driving backplane of the present disclosure, the first orthographic projection of the first gate does not cover the source region and/or the drain region due to the dual self-alignment. Therefore, no parasitic capacitance is generated between the source region and/or the drain region and the first gate, thereby alleviating the technical problem that the parasitic capacitance in the current driving backplane with the double-gate transistor is larger. Therefore, the driving backplane of the present disclosure may be used to drive the light-emitting device, so that the on-state current of the device may be increased, and the display brightness of the display panel may be improved.

Figure 6:
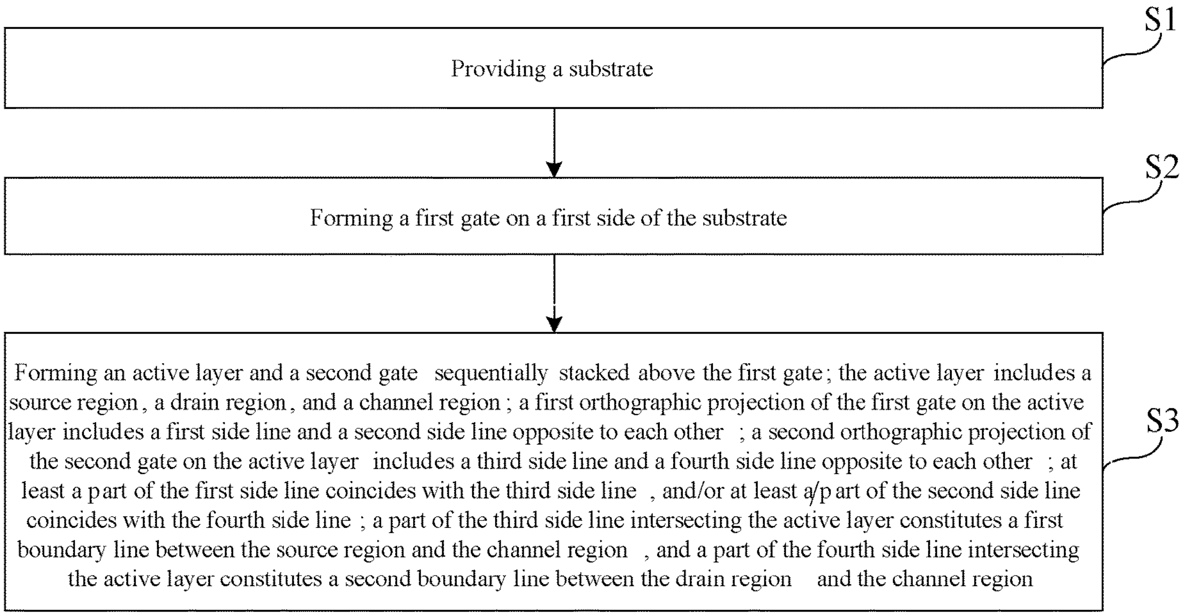
FIG. 6 is a flowchart of a method of manufacturing a driving backplane according to an embodiment of the present disclosure.

As shown in FIG. 6, which is a flowchart showing a method of manufacturing a driving backplane according to an embodiment of the present disclosure, the method specifically includes the following steps.

At step S1, a substrate is provided.

Figure 7A:
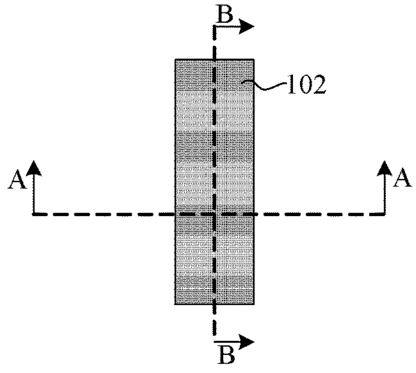
FIG. 7A is a top view of the driving backplane at a first stage of the method of manufacturing the driving backplane according to an embodiment of the present disclosure.
Figure 7B:
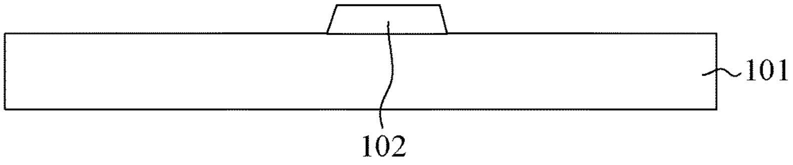
FIG. 7B is a cross-sectional view of the driving backplane taken along a line A-A of FIG. 7A.
Figure 7C:
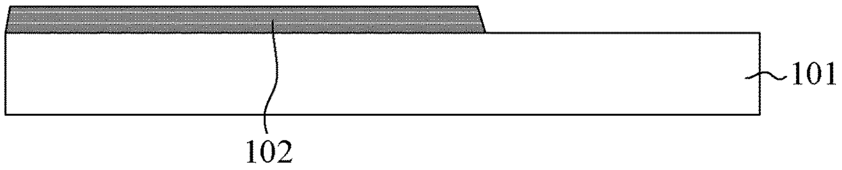
FIG. 7C is a cross-sectional view of the driving backplane taken along a line B-B of FIG. 7A.

As shown in FIGS. 7A to 7C, the substrate 101 may be a flexible substrate or a rigid substrate.

At step S2, a first gate is formed on a first side of the substrate.

As shown in FIGS. 7A to 7C, the first gate 102 is formed on the first side of the substrate 101, and the first side in FIGS. 7A to 7C refers to an upper surface of the substrate 101. The first gate 102 includes a conductive material, and may be formed by a deposition process and an etching process.

Figure 8A:
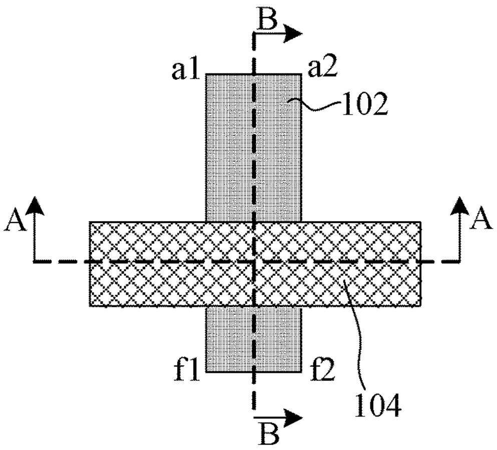
FIG. 8A is a top view of the driving backplane at a second stage of the method of manufacturing the driving backplane according to an embodiment of the present disclosure.
Figure 8B:
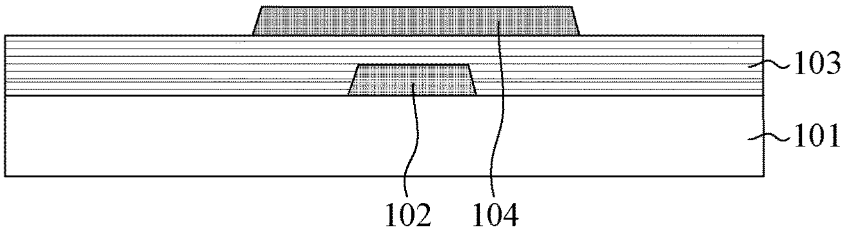
FIG. 8B is a cross-sectional view of the driving backplane taken along a line A-A of FIG. 8A.
Figure 8C:
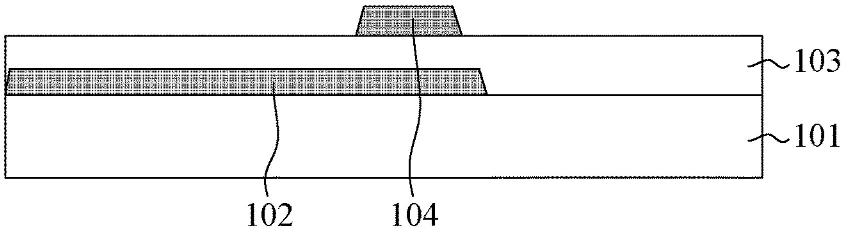
FIG. 8C is a cross-sectional view of the driving backplane taken along a line B-B of FIG. 8A.

In an embodiment, as shown in FIGS. 8A to 8C, an entire layer of the first gate insulating layer 103 covering the first gate 102 and the substrate 101 is also formed on the first gate 102, and the material of the first gate insulating layer 103 is an inorganic material, which also serves as a buffer layer, and may be formed by a deposition process.

At step S3, an active layer and a second gate which are stacked are formed on the first gate; the active layer includes a source region, a drain region, and a channel region, a first orthographic projection of the first gate on the active layer includes a first side line and a second side line opposite to each other, a second orthographic projection of the second gate on the active layer includes a third side line and a fourth side line opposite to each other. At least a part of the first side line coincides with the third side line, and/or at least a part of the second side line coincides with the fourth side line. An intersecting part of the active layer and the third side line is formed as a first boundary line between the source region and the channel region, and an intersecting part of the active layer and the fourth side line is formed as a second boundary line between the drain region and the channel region.

Figure 9A:
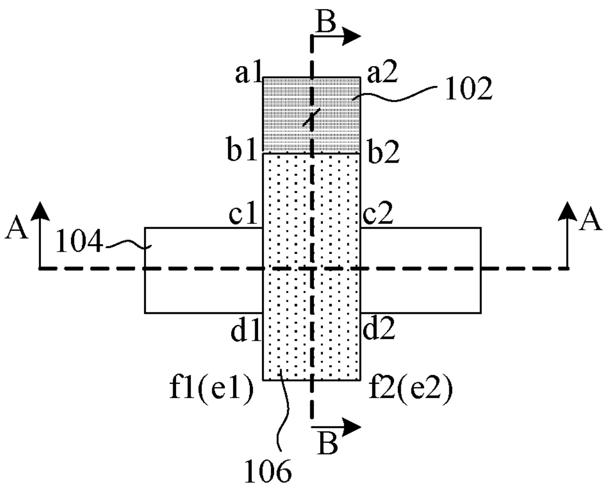
FIG. 9A is a top view of the driving backplane at a third stage of the method of manufacturing the driving backplane according to an embodiment of the present disclosure.
Figure 9B:
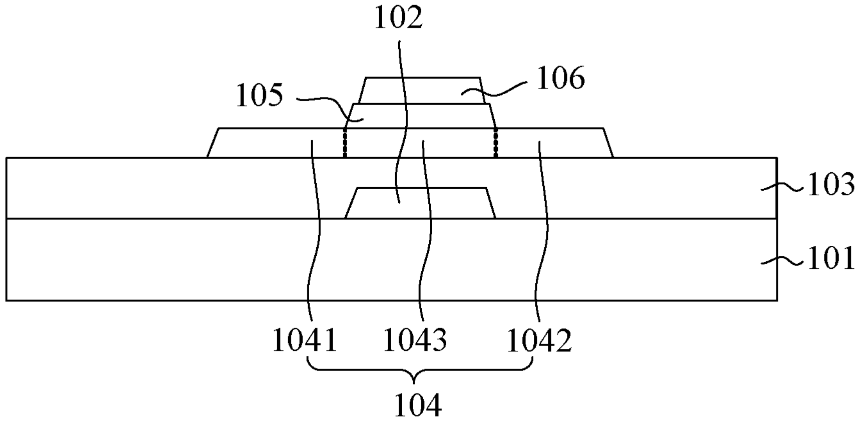
FIG. 9B is a cross-sectional view of the driving backplane taken along a line A-A of FIG. 9A.
Figure 9C:
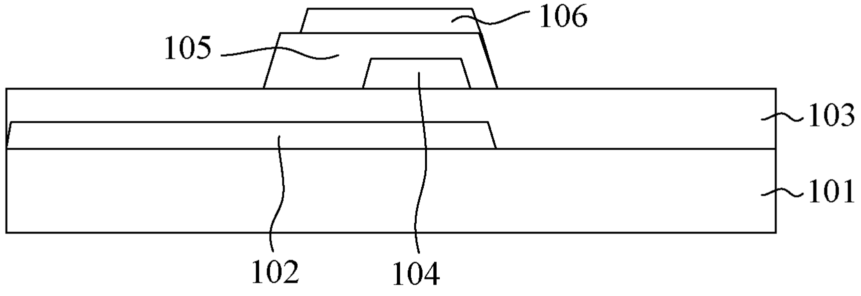
FIG. 9C is a cross-sectional view of the driving backplane taken along a line B-B of FIG. 9A.

As shown in FIGS. 8A to 8C, an active layer 104 is formed on the first gate 102, and may be formed by the deposition process and the etching process. As shown in FIGS. 9A to 9C, the second gate 106 is formed on the side of the active layer 104 away from the first gate 102, and may be prepared by the deposition process and the etching process. The active layer 104 includes an oxide semiconductor material, such as IGZO, and includes a source region 1041, a drain region 1042, and a channel region 1043.

In an embodiment, as shown in FIGS. 9A to 9C, a second gate insulating layer 105 is also formed on the side of the active layer 104 away from the substrate 101, the material of the second gate insulating layer 105 is an inorganic material, and may be formed by the deposition process, and the second gate 106 is formed on a side of the second gate insulating layer 105 away from the substrate 101.

Taking a horizontal plane where a bottom surface of the active layer 104 is located as a reference plane, the first gate 102 is projected in the vertical direction onto the reference plane, so that a first orthographic projection may be formed, and the first orthographic projection includes a first side line and a second side line opposite to each other. In FIGS. 8A and 9A, the first side line is represented by a line segment a1f1, and the second side line is represented by a line segment a2f2, and an outer contour of the first orthographic projection is represented by a1f1f2a2.

The second gate 106 is projected in the vertical direction onto the horizontal reference plane of the active layer 104, so that a second orthographic projection may be formed, the second orthographic projection includes a third side line and a fourth side line opposite to each other. In FIG. 9A, the third side line is represented by a line segment b1e1, the fourth side line is represented by a line segment b2e2, and an outer contour of the second orthographic projection is represented by b1e1e2b2. An intersecting part of the active layer 104 and the third side line b1e1 is represented by a line segment c1d1, an intersecting part of the fourth side line b2e2 and the active layer 104 is represented by a line segment c2d2, a channel region 1043 is formed in an area enclosed by c1d1d2c2 in the active layer 14, a source region 1041 is formed in an area to the left of the c1d1, a drain region 1042 is formed in an area to the right of the c2d2, the line segment c1d1 is formed as a first boundary line between the source region 1041 and the channel region 1043, and the line segment c2d2 is formed as a second boundary line between the drain region 1042 and the channel region 1043. In this manner, the second gate 106 and the source region 1041 are self-aligned in the vertical direction through the third side line b1e1 and the first boundary line c1d1, and the second gate 106 and the drain region 1042 are self-aligned in the vertical direction through the fourth side line b2e2 and the second boundary line c2d2, such that the second orthographic projection of the second gate does not overlap both the source region 1041 and the drain region 1042.

Figure 12A:
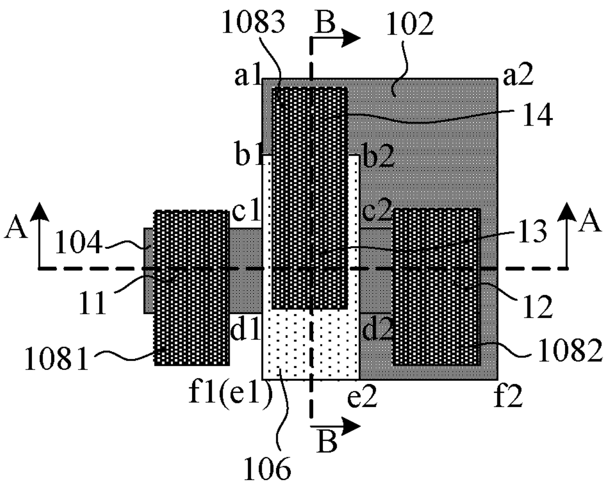
FIG. 12A is a top view of a second structure of the driving backplane at the fifth stage of the method of manufacturing the driving backplane according to an embodiment of the present disclosure.

At least a part of the first side line a1f1 coincides with the third side line b1e1, and/or at least a part of the second side line a2f2 coincides with the fourth side line b2e2, which may include three cases: at least a part of the first side line a1f1 coincides with the third side line b1e1, and at least a part of the second side line a2f2 coincides with the fourth side line b2e2; at least a part of the first side line a1f1 coincides with the third side line b1e1, and the second side line a2f2 does not coincide with the at least a part of the fourth side line b2e2; and the first side line a1f1 does not coincide with at least a part of the third side line b1e1, and at least a part of the second side line a2f2 coincides with the fourth side line b2e2. The first case is shown in FIG. 9A, and the second case is shown in FIG. 12A. The third case is similar to the case shown in FIG. 12A, except that they mirror each other. Therefore, the following embodiments are described with reference to FIG. 12A as an example. At least a part of the first side line a1f1 coincides with the third side line b1e1, which means that the third side line b1e1 coincides with part or all of the line segment of the first side line a1f1, and at least a part of the second side line a2f2 coincides with the fourth side line b2e2, which means that the fourth side line b2e2 coincides with part or all of the line segment of the second side line a2f2. In this manner, the first gate 102 and the second gate 106 are self-aligned in the vertical direction through the coinciding part of the first side line a1f1 and the third side line b1e1, and/or are self-aligned in the vertical direction through the coinciding parts of the second side line a2f2 and the fourth side line b2e2.

As shown in FIGS. 3A to 3B, in the existing dual-gate structure, the first orthographic projection of the first gate 102 on the substrate 101 completely covers the source region 1041 and the drain region 1042 as well as the channel region 1043 of the active layer 104, so that a parasitic capacitance is generated between the source region 1041 and the first gate 102, and between the drain region 1042 and the first gate 102, which affects the operation of the driving circuit.

In the embodiment of the present disclosure, when the dual-gate structure shown in FIGS. 9A to 9C is obtained by the above-described manufacturing method, since at least a part of the first side line a1f1 coincides with the third side line b1e1, the second gate 106 and the first gate 102 are self-aligned in the vertical direction through the coinciding part of the third side line b1e1 and the first side line a1f1, and since the second gate 106 and the source region 1041 are self-aligned in the vertical direction through the third side line b1e1 and the first boundary line c1d1, the second orthographic projection of the second gate 106 does not overlap the source region 1041. Therefore, the first orthographic projection of the first gate 102 does not cover the source region 1041 by the double self-alignment, so that the parasitic capacitance is not generated between the source region 1041 and the first gate 102. At the same time, since at least part of the second side line a2f2 coincides with the fourth side line b2e2, the second gate 106 and the first gate 102 are self-aligned in the vertical direction through the coinciding part of the fourth side line b2e2 and the second side line a2f2, and since the second gate 106 and the drain region 1042 are self-aligned in the vertical direction through the fourth side line b2e2 and the second boundary line c2d2, the second orthographic projection of the second gate 106 does not overlap the drain region 1042. Therefore, the first orthographic projection of the first gate 102 does not cover the drain region 1042 by double self-alignment, so that the parasitic capacitance is not generated between the drain region 1042 and the first gate 102. Compared with the structure shown in FIGS. 3A and 3B, the structure shown in FIGS. 9A to 9C do not generate parasitic capacitance in both the source region 1041 and the drain region 1042, so that the parasitic capacitance is eliminated, thereby alleviating the technical problem that the parasitic capacitance in the driving backplane in which the double-gate transistor is currently used is large.

Figure 12B:
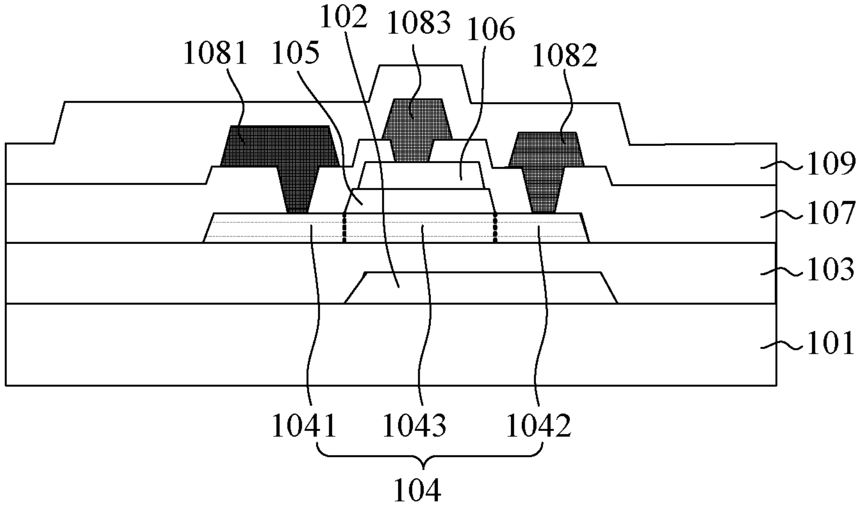
FIG. 12B is a cross-sectional view of the driving backplane taken along a line A-A of FIG. 12A.
Figure 12C:
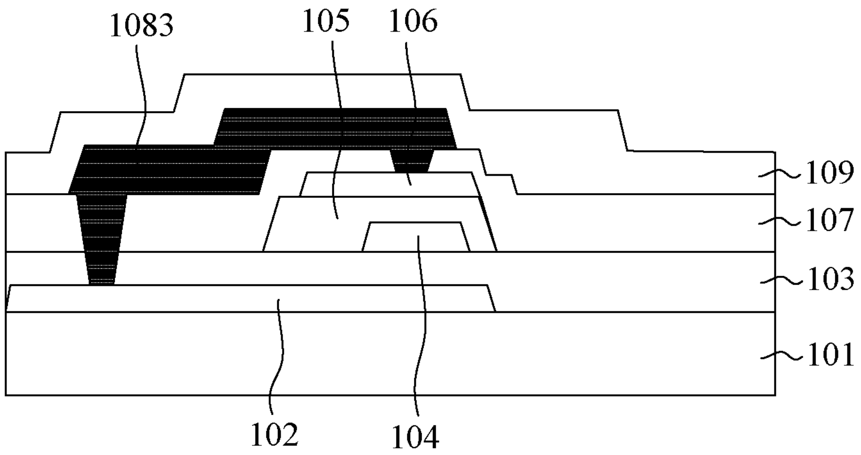
FIG. 12C is a cross-sectional view of the driving backplane taken along a line B-B of FIG. 12A.

When the second gate 106 and the first gate 102 are self-aligned in the vertical direction by only the third side line b1e1 and the first side line a1f1 or are self-aligned in the vertical direction by only the fourth side line b2e2 and the second side line a2f2 in the above process, taking only the third side line b1e1 and the first side line a1f1 for the self-alignment as an example, the structures shown in FIGS. 12A to 12C are finally obtained, although the parasitic capacitance is not generated in the source region 1041 only, compared with the structure shown in FIGS. 3A and 3B, the parasitic capacitance is reduced, and the technical problem of the larger parasitic capacitance in the current driving backplane in which the double-gate structure transistor is used is alleviated to some extent.

In an embodiment, after the step S3, the method further includes a step S4: an interlayer dielectric layer and a source-drain layer which are stacked are formed on a side of the second gate away from the substrate, the source-drain layer is patterned to form a source, a drain, and a double-gate connection line, the source is connected to the source region of the active layer, the drain is connected to the drain region of the active layer, and both ends of the double-gate connection line are connected to the first gate and the second gate, respectively.

Figure 10A:
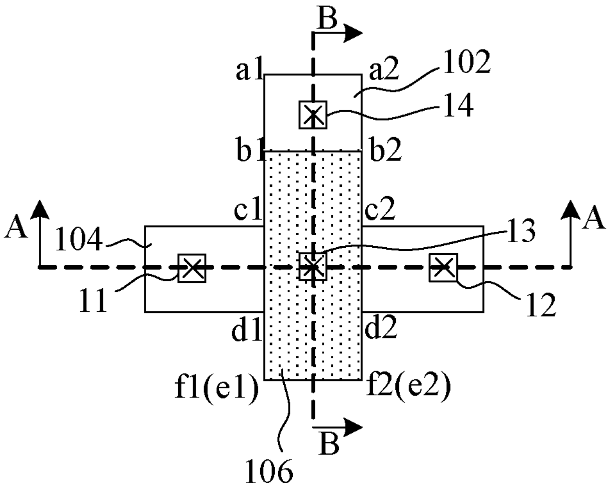
FIG. 10A is a top view of the driving backplane at a fourth stage of the method of manufacturing the driving backplane according to an embodiment of the present disclosure.
Figure 10B:
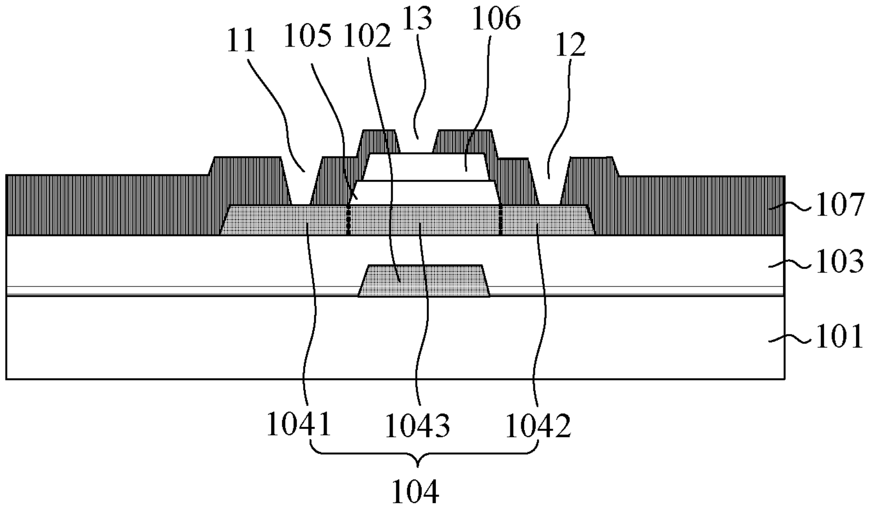
FIG. 10B is a cross-sectional view of the driving backplane taken along a line A-A of FIG. 10A.
Figure 10C:
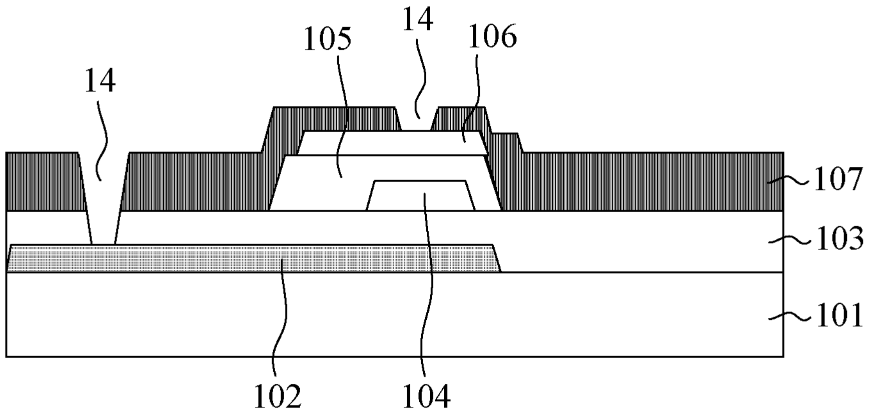
FIG. 10C is a cross-sectional view of the driving backplane taken along a line B-B of FIG. 10A.
Figure 11A:
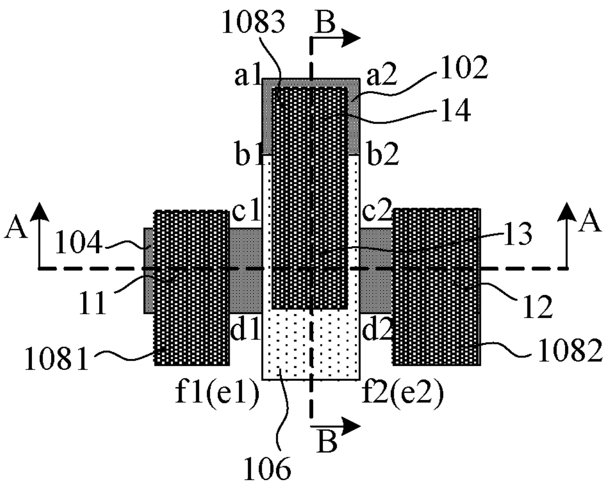
FIG. 11A is a top view of a first structure of the driving backplane at a fifth stage of the method of manufacturing the driving backplane according to an embodiment of the present disclosure.
Figure 11B:
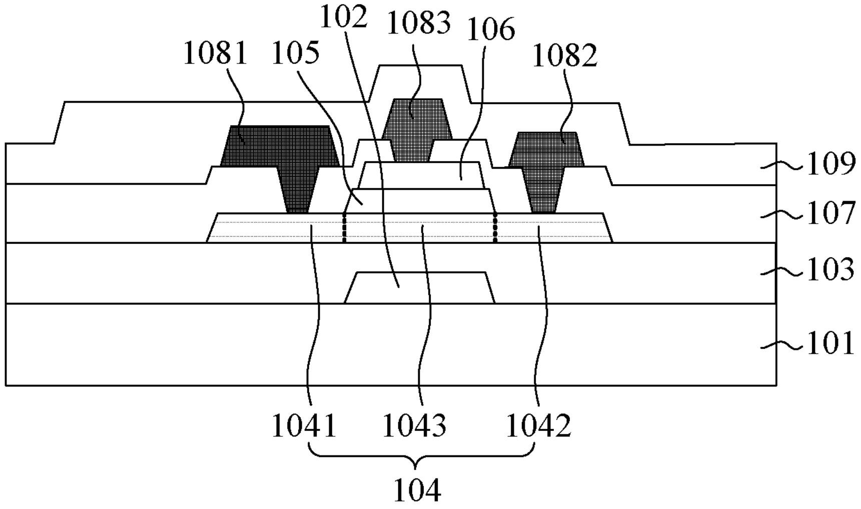
FIG. 11B is a cross-sectional view of the driving backplane taken along a line A-A of FIG. 11A.
Figure 11C:
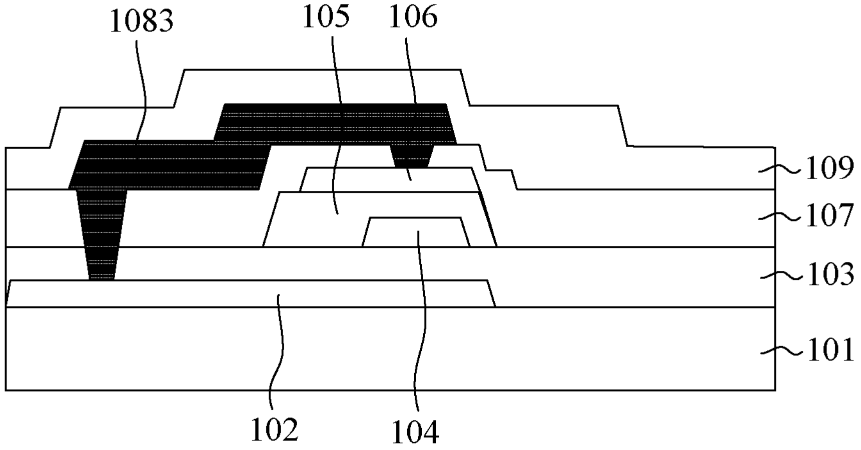
FIG. 11C is a cross-sectional view of the driving backplane taken along a line B-B of FIG. 11A.

As shown in FIGS. 10A to 10C, the interlayer dielectric layer 107 is formed in the whole layer to cover the second gate 106 and the first gate insulating layer 103, and the material of the interlayer dielectric layer 107 is an inorganic material, and may be formed by a deposition process. As shown in FIGS. 11A to 11C, the source-drain layer includes a source 1081 connected to the source region 1041 of the active layer 104 through a via hole, a drain 1082 connected to the drain region 1042 of the active layer 104 through a via hole, and a double-gate connection line 1083 connected at both ends to the first gate 102 and the second gate 106 through via holes, respectively. The source 1081 and the drain 1082 are both independent of the double-gate connection line 1083, so that independent transmission of a control signal may be realized. When the driving circuit is formed, the first gate 102 is connected to the first gate driving signal line to receive the first gate driving signal, the second gate 106 is connected to the second gate driving signal line to receive the second gate driving signal, the transistor is turned on under the joint action of the first gate driving signal and the second gate driving signal, one of the source 1081 and the drain 1082 is connected to the data line to receive the data signal, and a current is formed between the source region 1041 and the drain region 1042 of the active layer 104, so that the driving circuit may operate normally. Since the double-gate structure may be operated under the joint action of the first gate driving signal and the second gate driving signal, the on-state current may be increased, so that the brightness of the display panel may be improved.

A passivation layer 109 is also formed over the source-drain layer, and the passivation layer 109 is formed in a whole layer, and covers the source-drain layer and the interlayer dielectric layer 107.

In an embodiment, the step S4 specifically includes the following steps.

At step S41, an interlayer dielectric layer is formed on the side of the second gate away from the substrate.

As shown in FIGS. 10A to 10C, the entire interlayer dielectric layer 107 is first formed.

At step S42, a first via hole corresponding to the source region, a second via hole corresponding to the drain region, a third via hole corresponding to the second gate, and a fourth via hole are formed in the interlayer dielectric layer, the first orthographic projection includes a first sub-orthographic projection and a second sub-orthographic projection, the first sub-orthographic projection coincides with the second orthographic projection, the second sub-orthographic projection does not overlap with the second orthographic projection, the third via hole is formed within the first sub-orthographic projection, and the fourth via hole is formed within the second sub-orthographic projection.

As shown in FIGS. 10A to 10C, a first via hole 11 extends through the interlayer dielectric layer 107 and is located in the source region 1041, the second via hole 12 extends through the interlayer dielectric layer 107 and is located in the drain region 1042, the third via hole 13 extends through the interlayer dielectric layer 107 and is located in the region in which the second gate 106 is located, and the fourth via hole 14 extends through the interlayer dielectric layer 107 and the first gate insulating layer 103 and is located in the region in which the first gate 102 is located. Since the second gate 106 needs to be connected to the first gate 102 through the dual-gate connection line 1083, and the dual-gate connection line 1083 needs to be connected to the first gate 102 through the fourth via hole 14, in order to avoid a short circuit caused by the existence of two connection points between the second gate 106 and the dual-gate connection line 1083, the fourth via hole 14 needs to be formed within an area not covered by the second orthographic projection of the second gate 106. Therefore, the second orthographic projection of the second gate 106 only coincides with a part of the first orthographic projection of the first gate 102, the coinciding part is the first sub-orthographic projection, which is represented by b1e1e2b2 in FIG. 9A, and the non-coinciding part a1b1b2a2 is the second sub-orthographic projection. When the third via hole 13 is formed within the first sub-orthographic projection, a first end of the double-gate connection line 1083 is connected to the top of the second gate 106.

At step S43, a source-drain layer is formed on a side of the interlayer dielectric layer away from the substrate, and is patterned to from a source, a drain and a double-gate connection line, the source and the drain are independent of the double-gate connection line, the source is connected to a source region of the active layer through a first via hole, the drain is connected to a drain region of the active layer through a second via hole, a first end of the double-gate connection line is connected to a second gate through a third via hole, and a second end of the double-gate connection line is connected to the first gate through a fourth via hole.

As shown in FIGS. 11A to 11C, a source-drain layer is formed and patterned on the side of the interlayer dielectric layer 107 away from the substrate 101, and a resulted source 1081 is connected to the source region 1041 of the active layer 104 through the first via hole 11, a drain 1082 is connected to the drain region 1042 of the active layer 104 through the second via hole 12, a first end of a double-gate connection line 1083 is connected to the second gate 106 through the third via hole 13, and a second end of the double-gate connection line 1083 is connected to the first gate 102 through the fourth via hole 14.

In an embodiment, the step S3 specifically includes the following steps.

At step S31, an active layer, a conductive layer, and a photoresist layer which are stacked are formed on a side of the first gate away from the substrate.

Figure 13A:
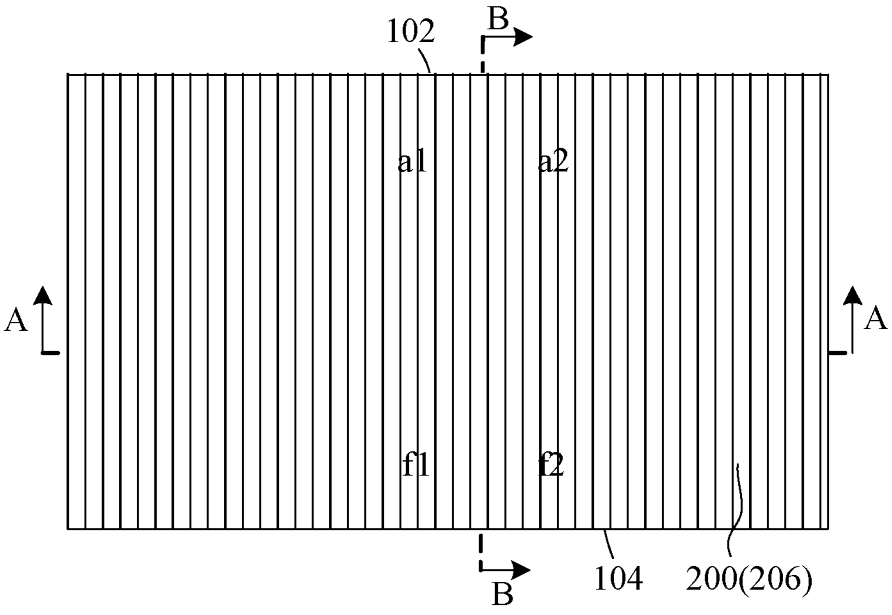
FIG. 13A is a top view of the driving backplane at a first sub-stage of the third stage of the method of manufacturing the driving backplane according to an embodiment of the present disclosure.
Figure 13B:
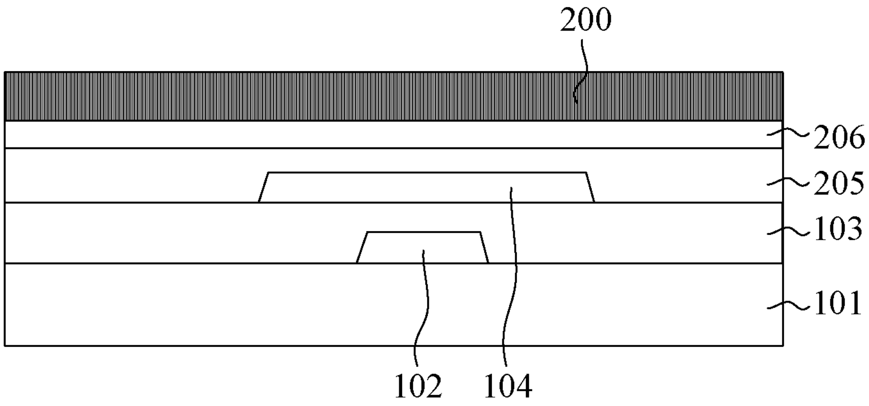
FIG. 13B is a cross-sectional view of the driving backplane taken along a line A-A of FIG. 13A.
Figure 13C:
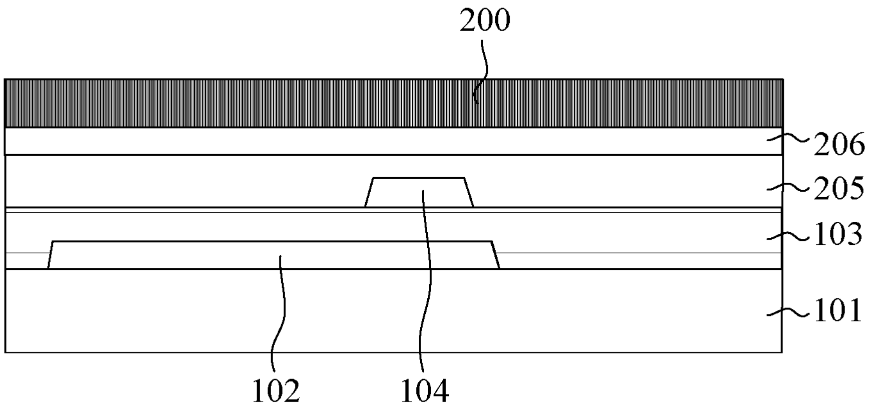
FIG. 13C is a cross-sectional view of the driving backplane taken along a line B-B of FIG. 13A.

As shown in FIGS. 13A to 13C, an oxide semiconductor thin film is first deposited on the first gate insulating layer 103 to form the active layer 104. At this stage, the active layer 104 has not been conductorized and has not been partitioned. Then, an entire layer of insulating film is deposited on the active layer 104 to form the insulating layer 205, an entire layer of conductive material is deposited on the insulating layer 205 to form the conductive layer 206, and an entire layer of photoresist layer 200 is formed on the conductive layer 206 and may be formed by a coating process. When the above processes is completed, the first orthographic projection of the first gate 102 formed on the active layer 104 includes the first side line a1f1 and the second side line a2f2 opposite to each other.

At step S32, the photoresist layer is patterned to form a photoresist pattern, the third orthographic projection of the photoresist pattern formed on the active layer includes a fifth side line and a sixth side line opposite to each other, at least a part of the first side line coincides with the fifth side line, and/or at least a part of the second side line coincides with the sixth side line.

Figure 16A:
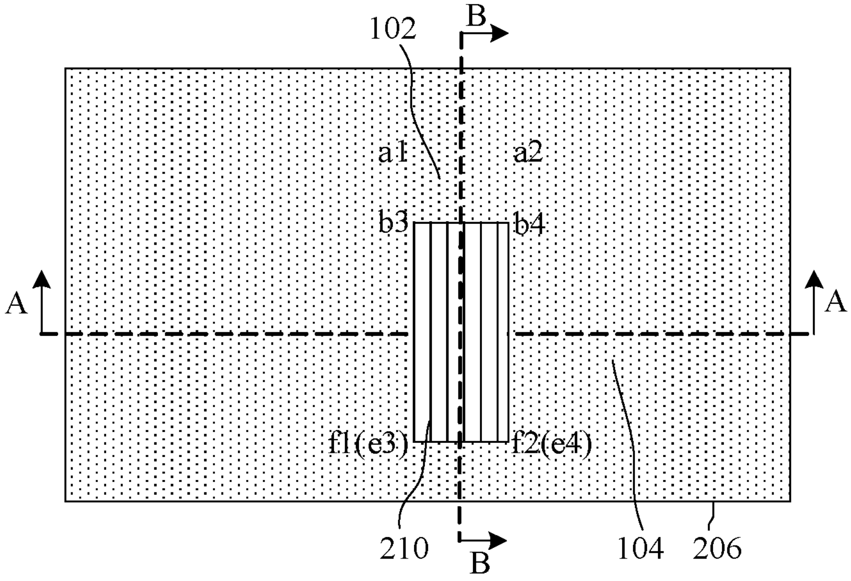
FIG. 16A is a top view of the driving backplane at a fourth sub-stage of the third stage of the method of manufacturing the driving backplane according to an embodiment of the present disclosure.
Figure 16B:
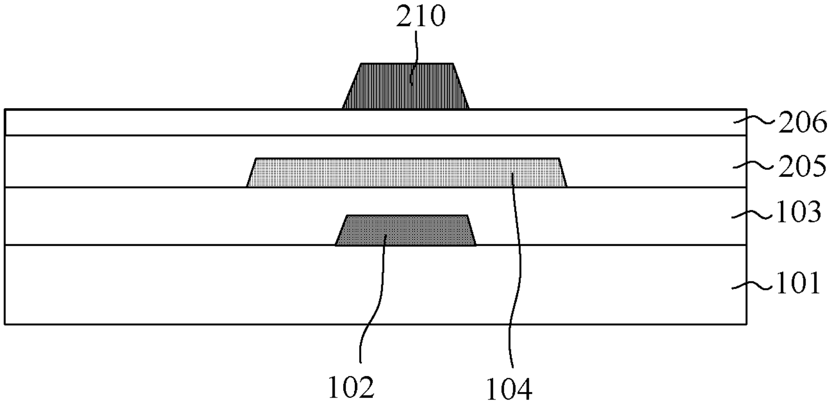
FIG. 16B is a cross-sectional view of the driving backplane taken along a line A-A of FIG. 16A.
Figure 16C:
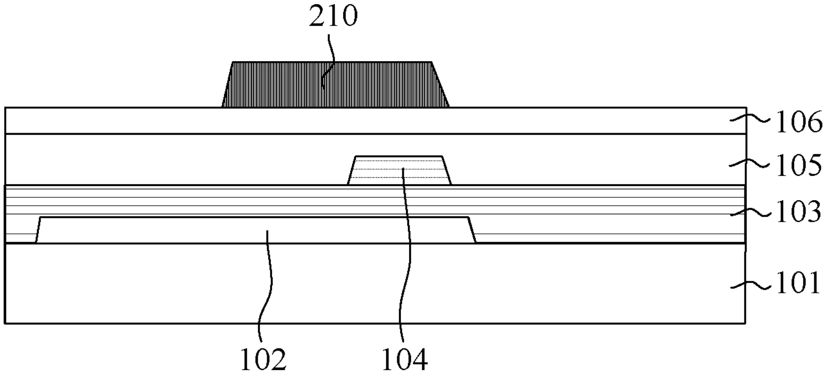
FIG. 16C is a cross-sectional view of the driving backplane taken along a line B-B of FIG. 16A.

As shown in FIGS. 16A to 16C, the photoresist layer 200 is patterned to form a photoresist pattern 210, and the third orthographic projection of the photoresist pattern 210 formed on the horizontal reference plane of the active layer 104 includes a fifth side line b3e3 and a sixth side line b4e4 which are oppositely disposed. At least a part of the first side line a1f1 coincides with the fifth side line b3e3, and/or at least a part of the second side line a2f2 coincides with the sixth side line b4e4, which may include three cases: at least a part of the first side line a1f1 coincides with the fifth side line b3e3, and at least a part of the second side line a2f2 coincides with the sixth side line b4e4; at least a part of the first side line a1f1 coincides with the fifth side line b3e3, and the second side line a2f2 does not coincide with the at least a part of the sixth side line b4e4; and the first side line a1f1 does not coincide with at least a part of the fifth side line b3e3, and at least a part of the second side line a2f2 coincides with the sixth side line b4e4. The first case is shown in FIG. 16A. At least a part of the first side line a1f1 coincides with the fifth side line b3e3, which means that the fifth side line b3e3 coincides with a part or all of the line segment of the first side line a1f1, and at least a part of the second side line a2f2 coincides with the sixth side line b4e4, which means that the sixth side line b4e4 coincides with a part or all of the line segment of the second side line a2f2. In this manner, the first gate 102 and the photoresist pattern 210 are self-aligned in the vertical direction through the coinciding part of the first side line a1f1 and the fifth side line b3e3, and/or are self-aligned in the vertical direction through the coinciding part of the second side line a2f2 and the sixth side line b4e4.

At step S33, a second gate is obtained by patterning the conductive layer and the insulating layer from the first side of the substrate using the photoresist pattern as a mask.

Figure 17A:
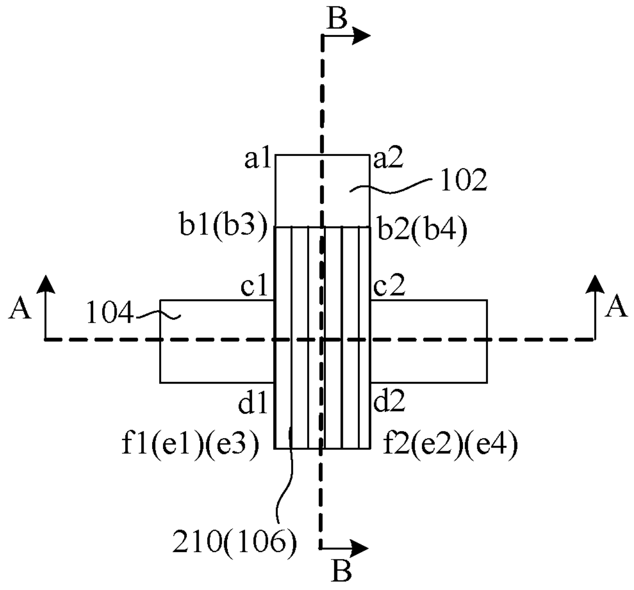
FIG. 17A is a top view of a first structure of the driving backplane at a fifth sub-stage of the third stage of the method of manufacturing the driving backplane according to an embodiment of the present disclosure.
Figure 17B:
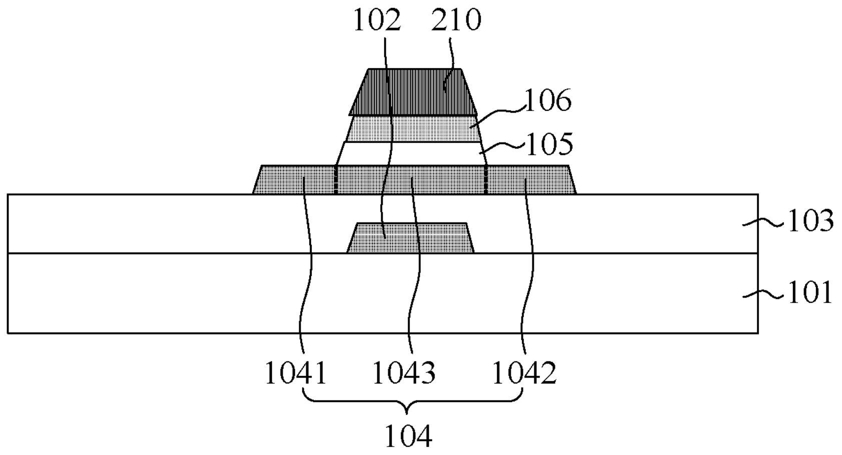
FIG. 17B is a cross-sectional view of the driving backplane taken along a line A-A of FIG. 17A.
Figure 17C:
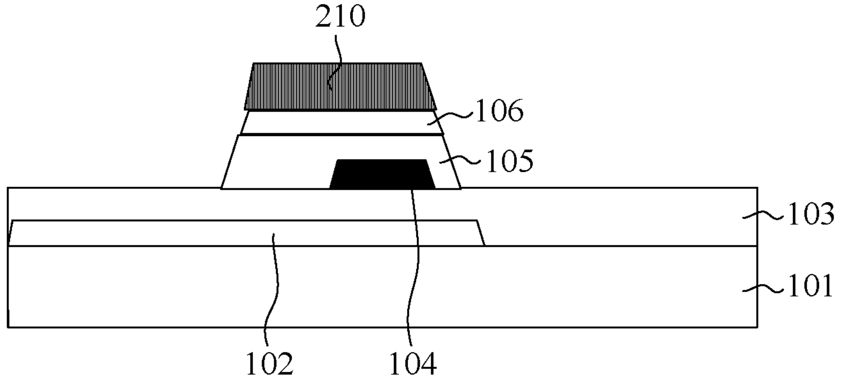
FIG. 17C is a cross-sectional view of the driving backplane taken along a line B-B of FIG. 17A.

For the structures shown in FIGS. 16A to 16C, a second gate 106 and a second gate insulating layer 105 as shown in FIGS. 17A to 17C may be obtained by synchronously etching the entire layer of the conductive layer 206 and the entire layer of the insulating layer 205 from the first side of the substrate 101 using the photoresist pattern 210 as a mask. The second gate 106 forms a second orthographic projection on the active layer, the second gate insulating layer 105 forms a fourth orthographic projection on the active layer, and the fourth orthographic projection coincides with the second orthographic projection completely. The second orthographic projection includes third and fourth side lines b1e1 and b2e2 opposite to each other, the second orthographic projection coincides completely with the third orthographic projection, the third side line b1e1 coincides completely with the fifth side line b3e3, and the fourth side line b2e2 coincides completely with the sixth side line b4e4. By this step, the second gate 106 and the photoresist pattern 210 are self-aligned in the vertical direction by the third side line b1e1 and the fifth side line b3e3, and/or are self-aligned in the vertical direction by the fourth side line b2e2 and the sixth side line b4e4.

At step S34, the second gate is used as a mask to conductorize the active layer, and the part to be conductorized forms a source region and a drain region of the active layer, and the part not to be conductorized forms a channel region of the active layer.

As shown in FIGS. 17A to 17C, the second gate 106 and the second gate insulating layer 105 are used as masks to conductorize the active layer from the first side of the substrate 101, and regions of the active layer 104 that are not shielded by the second gate 106 and the second gate insulating layer 105 are conductorized to form the source region 1041 and the drain region 1042, and the shielded regions are not conductorized to form the channel region 1043. The first boundary line c1d1 between the source region 1041 and the channel region 1043 is formed by an intersecting part of the third side line b1e1 and the active layer 104, and the second boundary line c2d2 between the drain region 1042 and the channel region 1043 is formed by an intersecting part of the fourth side line b2e2 and the active layer 104. In this manner, the second gate 106 and the source region 1041 are self-aligned in the vertical direction through the third side line b1e1 and the first boundary line c1d1 such that the second orthographic projection of the second gate 106 does not overlap the source region 1041, and the second gate 106 and the drain region 1042 are self-aligned in the vertical direction through the fourth side line b2e2 and the second boundary line c2d2 such that the second orthographic projection of the second gate 106 does not overlap the drain region 1042.

Figure 18A:
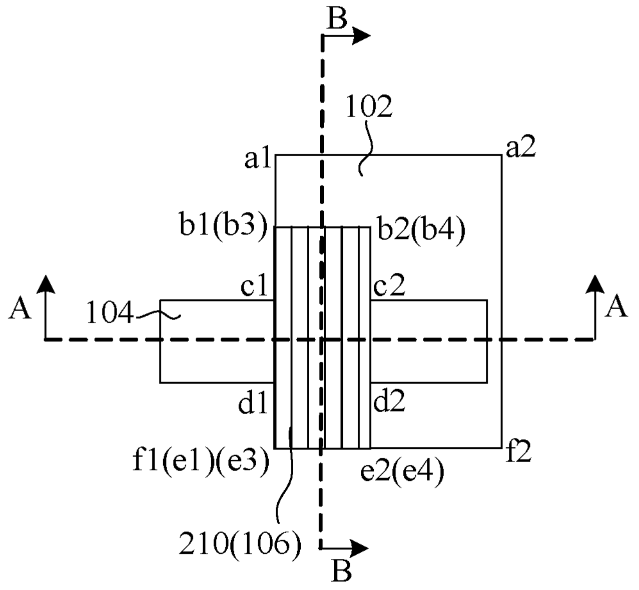
FIG. 18A is a top view of a second structure of the driving backplane at the fifth sub-stage of the third stage of the method of manufacturing the driving backplane according to an embodiment of the present disclosure.
Figure 18B:
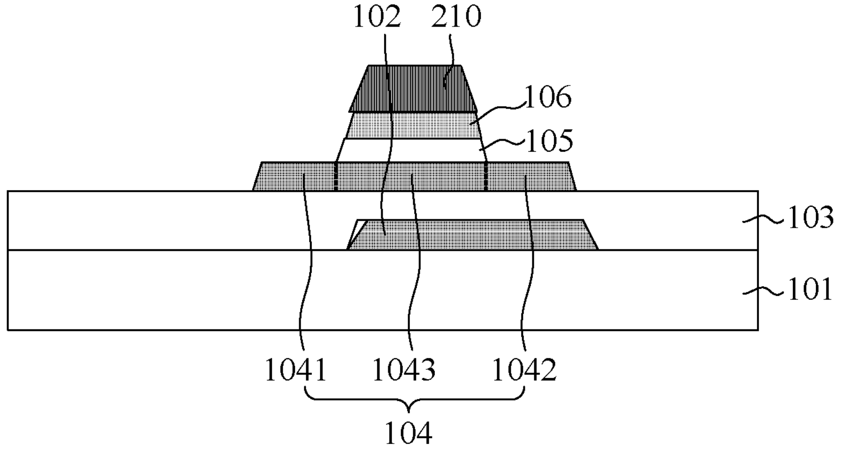
FIG. 18B is a cross-sectional view of the driving backplane taken along a line A-A of FIG. 18A.
Figure 18C:
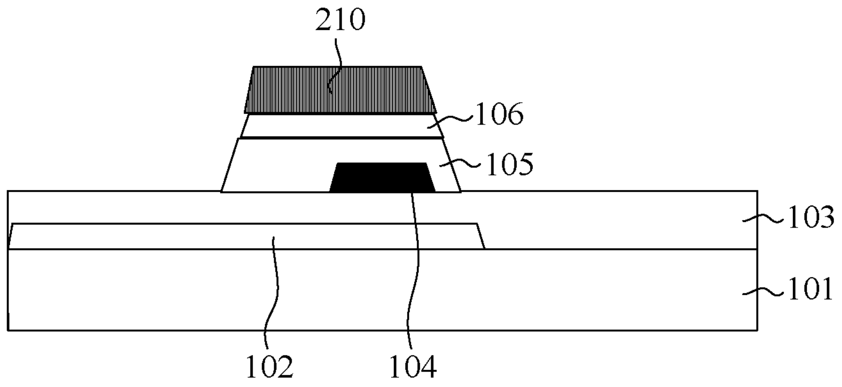
FIG. 18C is a cross-sectional view of the driving backplane taken along a line B-B of FIG. 18A.

When the first gate 102 and the photoresist pattern 210 are self-aligned in the vertical direction by only the first side line a1f1 and the fifth side line b3e3, or are self-aligned in the vertical direction by only the second side line a2f2 and the sixth side line b4e4, taking only the first side line a1f1 and the fifth side line b3e3 for the self-alignment as an example, the structure after the second gate 106 and the second gate insulating layer 107 are formed is shown in FIGS. 18A to 18C.

In an embodiment, the first gate includes an opaque conductive material, the second gate includes a transparent conductive material, and the step S32 includes the following steps.

At step S321, the photoresist layer is exposed from the second side of the substrate by using the first gate as a mask to obtain an unexposed first photoresist part and an exposed second photoresist part, and the first side and the second side of the substrate is disposed opposite to each other.

The material of the first gate 102 may be a MoTi/Cu or the like. When the first gate 102 includes an opaque conductive material, the first gate 102 may be used as a mask to form the second gate 106 so that the second orthographic projection of the resulted second gate 106 is within the range of the first orthographic projection of the first gate 102. The material of the second gate 106 may be ITO, IZO, or the like, and when it is a transparent conductive material, the aperture ratio may be improved.

Figure 14A:
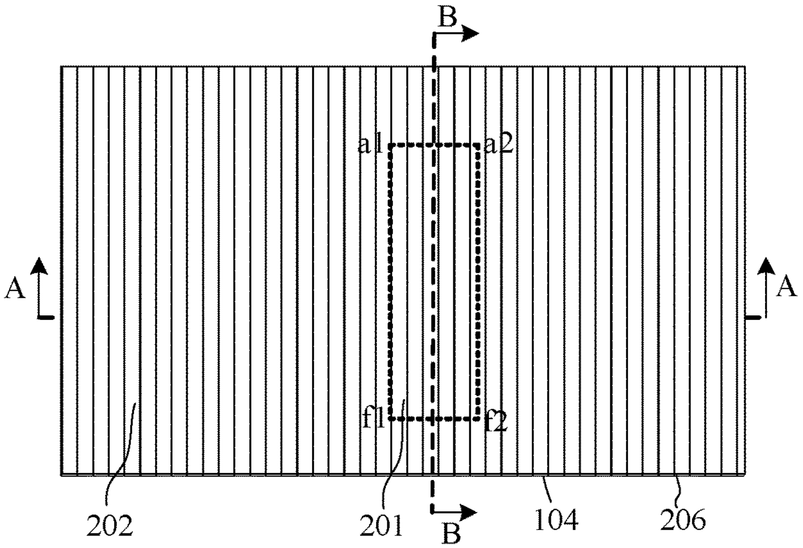
FIG. 14A is a top view of the driving backplane at a second sub-stage of the third stage of the method of manufacturing the driving backplane according to an embodiment of the present disclosure.
Figure 14B:
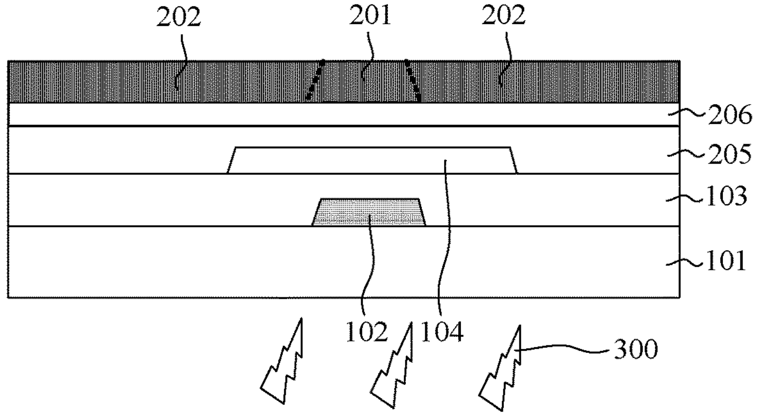
FIG. 14B is a cross-sectional view of the driving backplane taken along a line A-A of FIG. 14A.
Figure 14C:
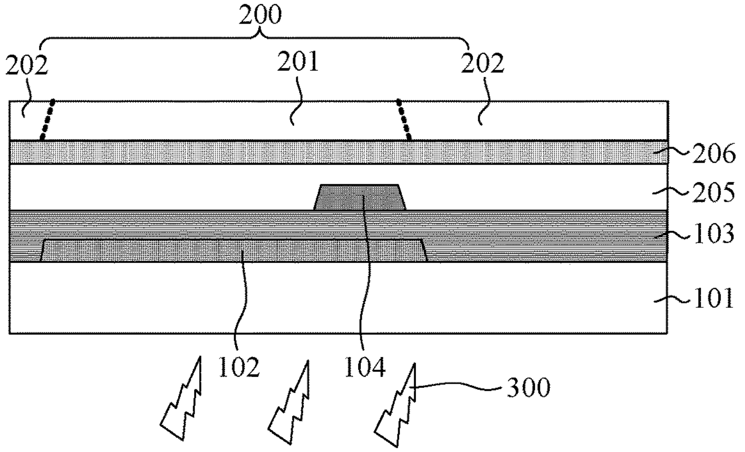
FIG. 14C is a cross-sectional view of the driving backplane taken along a line B-B of FIG. 14A.

As shown in FIGS. 14A to 14C, since the first gate 102 includes the opaque conductive material, the first gate 102 may be used as a mask, and UV light 300 is irradiated from the second side, that is, the lower side, of the substrate 101. The part of the photoresist layer 200 that is shielded by the first gate 102 is not exposed to light to form the first photoresist part 201, and the part of the photoresist layer 200 that is not shielded by the first gate 102 is exposed to light and split into small molecules to form the second photoresist part 202.

At step S322, a mask plate is used as a mask, a hollow region of the mask plate overlaps the partial region of the first photoresist part, and the photoresist layer is exposed from the first side of the substrate to obtain the unexposed first sub-photoresist part and the exposed second sub-photoresist part in the first photoresist part.

Figure 15A:
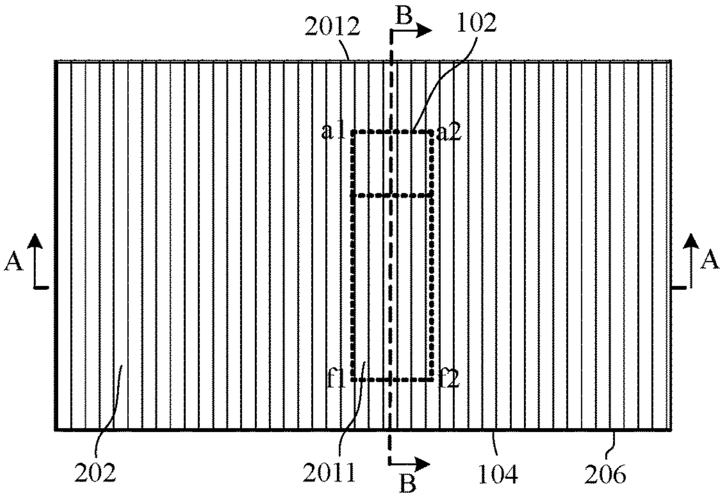
FIG. 15A is a top view of the driving backplane at a third sub-stage of the third stage of the method of manufacturing the driving backplane according to an embodiment of the present disclosure
Figure 15B:
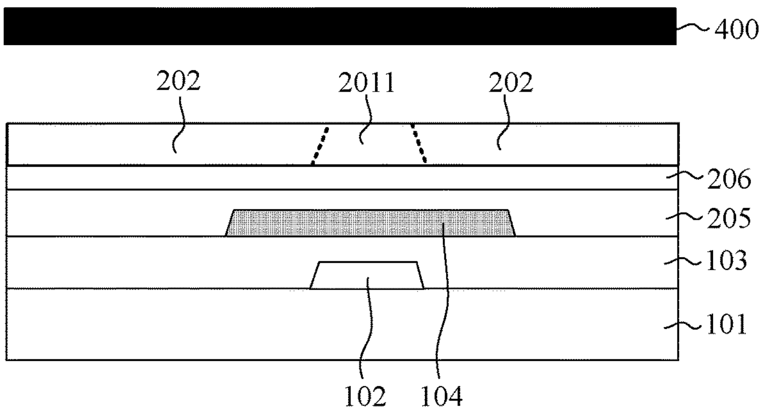
FIG. 15B is a cross-sectional view of the driving backplane taken along a line A-A of FIG. 15A.
Figure 15C:
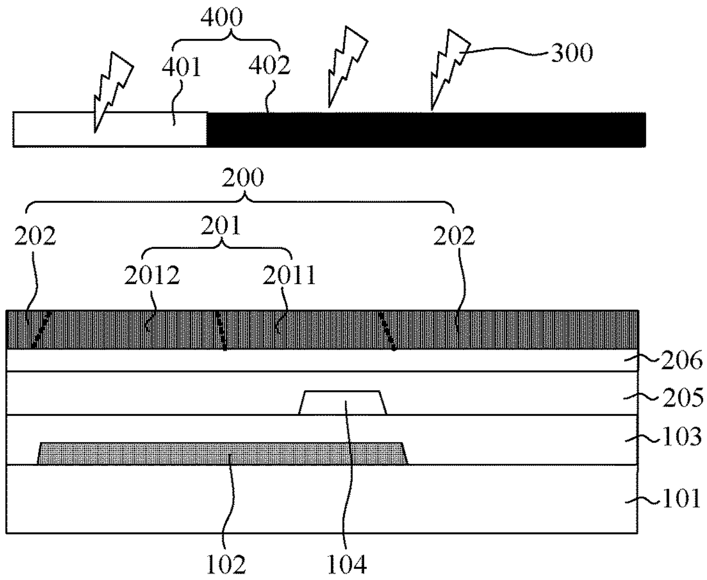
FIG. 15C is a cross-sectional view of the driving backplane taken along a line B-B of FIG. 15A.

As shown in FIGS. 15A to 15C, the mask plate 400 is placed directly above the structure shown in FIGS. 14A to 14C, the mask plate 400 is used as a mask, and UV light 300 is irradiated from the second side of the substrate 101. The mask plate 400 includes a hollow region 401 and a non-hollow region 402. The region of the first photoresist part 201 immediately below the non-hollow region 402 is not exposed, so as to form the first sub-photoresist part 2011, and the region of the first photoresist part 201 immediately below the hollow region 401 is exposed and split into small molecules to form the second sub-photoresist part 2012. The projection of the first sub-photoresist part 2011 on the active layer 104 is a third orthographic projection.

At step S323, the photoresist layer is developed to remove the second photoresist part and the second sub-photoresist part to obtain a photoresist pattern.

The second photoresist part 202 and the second sub-photoresist part 2012 that are exposed in FIGS. 16A to 16C are removed by the developing process, leaving only the first sub-photoresist part 2011, which forms the photoresist pattern 210 in FIGS. 17A to 17C, and the third orthographic projection is the orthographic projection of the photoresist pattern 210 on the active layer 104.

The first exposure step causes the unexposed first photoresist part 201 to fully coincide with the first gate 102 in the vertical direction, thereby achieving self-alignment of both. The second exposure and development step is to remove a part of the excess second sub-photoresist part 2012 from the first photoresist part 201, leaving a position for the connection point of the subsequent double-gate connection line 1083 with the first gate 102. The remaining first sub-photoresist part 2011 and the first gate 102 still achieve self-alignment in the vertical direction through the fifth side line b3e3 and the first side line a1f1, and/or achieve self-alignment in the vertical direction through the sixth side line b4e4 and the second side line a2f2.

By the above process, the second gate 106 is formed with the first gate 102 as a mask, to realize the self-alignment between the second gate 106 and the first gate 102, and then the source region 1041 and the drain region 1042 of the active layer 104 are formed with the second gate 106 as a mask, to realize the self-alignment between the source region 1041 and the drain region 1042, and the second gate 106, so that the source region 1041 and the drain region 1042 do not overlap the first gate 102 in the vertical direction.

An embodiment of the present disclosure further provides a display panel including a driving backplane and a light-emitting structure connected to the driving backplane, the driving backplane is the driving backplane described in any one of the above embodiments, the light-emitting structure may be a Mini LED, a Micro LED, an OLED, a liquid crystal layer, or the like, the display panel may be a Mini LED display panel, a Micro LED display panel, an OLED display panel, a liquid crystal display panel, or the like, each transistor in the driving backplane is used to form a driving circuit, and the driving circuit drives the light-emitting structure to emit light for display under the action of a driving signal. In the driving backplane, through the dual self-alignment of the first gate with the second gate, the second gate with the source region and the drain region, the first orthographic projection of the first gate on the active layer does not cover the source region and/or the drain region, so that no parasitic capacitance is generated between the source region and/or the drain region and the first gate, the parasitic capacitance is reduced or eliminated, and the technical problem of a larger parasitic capacitance in the current driving backplane in which the double-gate structure transistor is used is solved.

In the above-mentioned embodiments, the description of each embodiment has its own emphasis, and parts not described in detail in a certain embodiment may be referred to the related description of other embodiments.

The foregoing describes in detail driving backplanes, methods of manufacturing a driving backplane, and display panels according to some embodiments of the present disclosure. The principles and implementations of the present disclosure are described herein using specific examples. The description of the above embodiments is merely intended to help understand the core ideas of the present disclosure. It will be appreciated by those ordinary skilled in the art that modifications may be made to the foregoing embodiments, or equivalents may be used to replace some of the technical features therein. These modifications or substitutions are intended to fall within the scope of the present disclosure.

What is claimed is:

1. A method of manufacturing a driving backplane, comprising:

providing a substrate;

forming a first gate on a first side of the substrate; and forming an active layer and a second gate sequentially stacked above the first gate, wherein the second gate is connected to the first gate;

the active layer comprises a source region, a drain region, and a channel region;

a first orthographic projection of the first gate on the active layer has a first side line and a second side line opposite to each other;

a second orthographic projection of the second gate on the active layer has a third side line and a fourth side line opposite to each other;

at least a part of the first side line coincides with the third side line, and/or at least a part of the second side line coincides with the fourth side line; and a part of the third side line intersecting the active layer constitutes a first boundary line between the source region and the channel region, and a part of the fourth side line intersecting the active layer constitutes a second boundary line between the drain region and the channel region;

wherein the forming of the active layer and the second gate comprises:

forming the active layer, a conductive layer, and a photoresist layer sequentially stacked on a side of the first gate away from the substrate;

patterning the photoresist layer to form a photoresist pattern, a third orthographic projection of the photoresist pattern on the active layer having a fifth side line and a sixth side line opposite to each other, at least a part of the first side line coinciding with the fifth side line, and/or at least a part of the second side line coinciding with the sixth side line;

patterning the conductive layer with the photoresist pattern as a mask, to obtain the second gate; and conductorizing the active layer with the second gate as a mask, so that a conductorized part of the active layer forms the source region and the drain region, and a non-conductorized part of the active layer forms the channel region;

wherein the patterning of the photoresist layer to form the photoresist pattern comprises:

exposing the photoresist layer, with the first gate as a mask, from a side of the substrate away from the first gate, to obtain a first photoresist part that is unexposed and a second photoresist part that is exposed;

placing a mask plate on the exposed photoresist layer, a hollow region of the mask plate overlapping with a partial area of the first photoresist part;

exposing the photoresist layer from a side of the substrate provided with the mask plate, to obtain a first sub-photoresist part masked by the mask plate and a second sub-photoresist part corresponding to the hollow region; and developing the photoresist layer to remove the second photoresist part and the second sub-photoresist part, to obtain the photoresist pattern.

2. The method according to claim 1, further comprising: after the forming of the active layer and the second gate, forming an interlayer dielectric layer and a source-drain layer sequentially stacked on a side of the second gate away from the substrate, and patterning the source-drain layer to form a source, a drain, and a double-gate connection line, wherein the source is connected to the source region of the active layer, the drain is connected to the drain region of the active layer, and both ends of the double-gate connection line are connected to the first gate and the second gate respectively.

3. The method according to claim 2, wherein the forming of the interlayer dielectric layer and the source-drain layer and the patterning of the source-drain layer comprise:

forming the interlayer dielectric layer on the side of the second gate away from the substrate;

forming, in the interlayer dielectric layer, a first via hole corresponding to the source region, a second via hole corresponding to the drain region, a third via hole corresponding to the second gate, and a fourth via hole, wherein the first orthographic projection comprises a first sub-orthographic-projection coinciding with the second orthographic projection and a second sub-orthographic-projection non-overlapping with the second orthographic projection, the third via hole is formed within the first sub-orthographic-projection, and the fourth via hole is formed within the second sub-orthographic-projection;

forming the source-drain layer on a side of the interlayer dielectric layer away from the substrate; and patterning the source-drain layer to form the source, the drain, and the double-gate connection line, wherein each of the source and the drain is independent of the double-gate connection line, the source is connected to the source region of the active layer through the first via hole, the drain is connected to the drain region of the active layer through the second via hole, a first end of the double-gate connection line is connected to the second gate through the third via hole, and a second end of the double-gate connection line is connected to the first gate through the fourth via hole.

4. The method according to claim 3, wherein the second sub-orthographic projection is spaced apart from at least one of the drain region and the source region.

5. The method according to claim 1, wherein the first gate comprises an opaque conductive material, and the second gate comprises a transparent conductive material.

* * * * *